United States Patent
Iguchi et al.

(10) Patent No.: US 10,727,060 B2
(45) Date of Patent: Jul. 28, 2020

(54) DOPING SYSTEM, DOPING METHOD AND METHOD FOR MANUFACTURING SILICON CARBIDE SEMICONDUCTOR DEVICE

(71) Applicant: FUJI ELECTRIC CO., LTD., Kawasaki (JP)

(72) Inventors: Kenichi Iguchi, Matsumoto (JP); Haruo Nakazawa, Matsumoto (JP)

(73) Assignee: FUJI ELECTRIC CO., LTD., Kawasaki (JP)

(*) Notice: Subject to any disclaimer, the term of this patent is extended or adjusted under 35 U.S.C. 154(b) by 31 days.

(21) Appl. No.: 16/201,479

(22) Filed: Nov. 27, 2018

(65) Prior Publication Data
US 2019/0228971 A1    Jul. 25, 2019

(30) Foreign Application Priority Data

Jan. 19, 2018  (JP) ................. 2018-007315

(51) Int. Cl.

| | |
|---|---|
| *H01L 21/04* | (2006.01) |
| *B23K 26/00* | (2014.01) |
| *B23K 26/0622* | (2014.01) |
| *B23K 26/06* | (2014.01) |
| *B23K 26/352* | (2014.01) |
| *H01L 29/861* | (2006.01) |

(Continued)

(52) U.S. Cl.
CPC ...... *H01L 21/0455* (2013.01); *B23K 26/0006* (2013.01); *B23K 26/0622* (2015.10);
(Continued)

(58) Field of Classification Search
None
See application file for complete search history.

(56) References Cited

U.S. PATENT DOCUMENTS

| | | | |
|---|---|---|---|
| 8,941,122 B2 | 1/2015 | Kawai et al. | |
| 8,962,459 B2 * | 2/2015 | Inns ............ | H01L 21/2225 257/E21.491 |

(Continued)

FOREIGN PATENT DOCUMENTS

| | | |
|---|---|---|
| JP | 8264468 A | 10/1996 |
| JP | 2012146858 A | 8/2012 |

(Continued)

OTHER PUBLICATIONS

Ikeda, A. et al., "Effects of Substrate Heating on Al Doping Performed by Irradiating Laser Beam to Al Film on 4H—SiC", Graduate School of Information Science and Electrical Engineering, Kyushu University, Sep. 25-29, 2016, 11th European Conference on Silicon Carbide and Related Materials, pp. 249-250.

*Primary Examiner* — Zandra V Smith
*Assistant Examiner* — Lawrence C Tynes, Jr.

(57) ABSTRACT

A doping system includes a light source to emit an optical pulse; a light source controller connected to the light source, to control an energy density of the optical pulse; and a beam adjusting unit to irradiate the optical pulse to a surface of a doping-object made of silicon carbide on which an impurity-containing source-film containing impurity atoms is deposited. The light source controller irradiates a first optical pulse to the impurity-containing source-film so as to form a reaction-product layer in the doping-object, and irradiates a second optical pulse having an energy density higher than an energy density of the first optical pulse, so as to introduce the impurity atoms into the target through the reaction-product layer.

7 Claims, 21 Drawing Sheets

(51) Int. Cl.
    *H01L 29/66*         (2006.01)
    *H01L 29/16*         (2006.01)
    *H01L 29/167*       (2006.01)
    *H01L 29/872*       (2006.01)
    *H01L 29/06*         (2006.01)
    *H01L 29/45*         (2006.01)

(52) U.S. Cl.
    CPC ........ B23K 26/0626 (2013.01); B23K 26/352 (2015.10); H01L 29/861 (2013.01); H01L 29/8611 (2013.01); *H01L 29/0619* (2013.01); *H01L 29/0692* (2013.01); *H01L 29/167* (2013.01); *H01L 29/1608* (2013.01); *H01L 29/45* (2013.01); *H01L 29/6606* (2013.01); *H01L 29/872* (2013.01)

(56) References Cited

U.S. PATENT DOCUMENTS

| | | | |
|---|---|---|---|
| 9,263,267 | B2 | 2/2016 | Kawai et al. |
| 9,658,775 | B2 | 5/2017 | Guo |
| 9,659,775 | B2 * | 5/2017 | Ikeda .................. H01L 21/2254 |
| 2013/0285070 | A1 | 10/2013 | Kawai et al. |
| 2015/0079781 | A1 | 3/2015 | Kawai et al. |
| 2016/0247681 | A1 * | 8/2016 | Ikeda .................. H01L 21/0485 |

FOREIGN PATENT DOCUMENTS

| | | |
|---|---|---|
| JP | 2013214657 A | 10/2013 |
| JP | 2016157911 A | 9/2016 |
| JP | 201745962 A | 3/2017 |

\* cited by examiner

DOPING SYSTEM, DOPING METHOD AND METHOD FOR MANUFACTURING SILICON CARBIDE SEMICONDUCTOR DEVICE

CROSS REFERENCE TO RELATED APPLICATIONS

This application is based upon and claims the benefit of priority from the prior Japanese Patent Application No. P2018-007315 filed on Jan. 19, 2018, the entire contents of which are incorporated herein by reference.

BACKGROUND

1. Field of the Invention

The present invention relates to a doping system and a doping method for introducing an impurity atoms into a doping-object such as a silicon carbide (SiC) semiconductor, and a method for manufacturing a SiC semiconductor device using the doping method.

2. Description of the Related Art

A wide band gap semiconductor or an insulator, such as SiC, particularly 4H-SiC, has a small diffusion coefficient of an impurity atom (dopant). For example, when the semiconductor substrate is 4H-SiC, a high dose ions of about $10^{15}$ per square centimeter or more is implanted to the (0001) plane (or (000-1) plane) of 4H-SiC. In such case, in order to enhance activation of the impurity atoms together with recrystallization of the 4H-SiC, the semiconductor substrate is heated to a temperature range of 300° C. to 800° C. during ion implantation, and after the ion implantation, it is necessary to anneal the semiconductor substrate in a high temperature range of 1600° C. to 1800° C.

As described above, when the impurity-doped layer is formed by ion implantation and high temperature annealing, since the entire substrate is exposed to a high temperature, there is a problem of material deterioration or degradation, and the problem will greatly restrict the election of process-step sequence. Further, on the principle of operation, since the known ion implantation technologies is based on irradiating the substrate with accelerated beam of impurity ions, it is difficult to achieve a high-dose implanted layer on the outermost surface of the substrate.

For solving such a problem, JP 2012-146858 A discloses a laser doping method, by which the impurity atoms brought into contact with the surface of the substrate are doped in the inside the substrate, through the irradiation of the laser beam to the surface of the substrate. In the case of JP 2012-146858 A, the height of the protruding portions called "ridges", which are generated on the surface of the substrate, are lowered by irradiating the laser beam multiple times, thereby improving the surface morphology of the substrate. Further, JP 2013-214657 A discloses a technique in which a metallic electrode containing impurity atoms formed on the SiC substrate is irradiated with a laser beam, thereby simultaneously diffusing the metal atoms and the impurity atoms contained in the metallic electrode into the SiC substrate, so as to generate a reaction layer of the metal atoms and the SiC substrate, and the reaction layer is used as the contact layer. Further, JP H08-264468 A discloses a technique of forming a SiC semiconductor region in which p-type impurity atoms are doped, by irradiating the surface of the SiC substrate with a laser beam via a reaction gas containing the p-type impurity atoms or via a thin aluminum (Al) film deposited on the SiC substrate.

Further, JP 2017-045962 A and JP 2016-157911 A disclose techniques, in which the thickness of an Al thin film deposited on the SiC substrate and the energy density of each pulse of the pulsed-laser beams irradiated to the Al thin film are controlled so as to satisfy predetermined conditions, and the Al atoms are doped into the inside of the SiC substrate. In JP 2017-045962 A and JP 2016-157911 A, for example, the Al film is deposited on the surface of the n-type SiC substrate with a thickness of about 240 nm, and the pulsed-laser beams are irradiated in the atmospheric air at room temperature with the energy density of about 4.0 J/cm². As the light source of the pulsed-laser beam, the KrF excimer laser with a wavelength of 248 nm is used, and each pulsed-laser beam is irradiated in an irradiation time of 50 ns. As a result of the irradiation of the pulsed-laser beams, the Al atoms as the impurity atoms are doped at impurity concentration of about $6\times10^{21}$/cm³ or more, which exceeds the solid-solubility limit concentration of 4H-SiC in the outermost surface of the semiconductor substrate. Concurrently, at the depth of about 50 nm from the surface of the SiC substrate, the Al atoms are doped at concentration of about $1\times10^{20}$/cm³, which is close to the solid-solubility limit concentration of 4H-SiC.

However, in the case of JP 2012-146858 A, a method for increasing the dopant penetration depth of the impurity atoms into the substrate, by irradiation with the multiple laser beams, is not disclosed. Further, in the case of JP 2013-214657 A, it is difficult to reproduce the technique in practice, since the specific descriptions concerning various conditions etc. in the embodiments in the detailed description of the specification are not necessarily sufficient. In addition, since the simultaneous diffusions of metal atoms and impurity atoms may be realized only for the combination in which the respective diffusion coefficients are equivalent, the technique of the JP 2013-214657 A is limited greatly by practical problem.

In the case of JP H08-264468 A, although it is possible to introduce the impurity atoms, the energy density (power density) of the laser beam is as small as 1.5 J/cm², and even when the laser beams are irradiated iteratively, for example, 4000 times, the dopant penetration depth of the impurity atoms will be less than 50 nm. In a power semiconductor device (power device) which is required to have high breakdown voltage and large current density, the dopant penetration depth may be required to be about ten times as large as that of the dopant penetration depth obtained by 4000 times iteration of the irradiation. Therefore, the dopant penetration depth obtained by the technique of JP H08-264468 A is too shallow and it is difficult to put into practical use. Further, even in the case of using the technique of JP 2017-045962 A or JP 2016-157911 A, since the dopant penetration depth to be realized remains at about 100 nm to 200 nm, the dopant penetration depth may be by no means sufficient and further effective technology have been required.

SUMMARY OF THE INVENTION

In order to solve the above problems, an aspect of the present invention inheres in a doping system encompassing: (a) a light source configured to emit an optical pulse; (b) a light source controller connected to the light source, configured to control an energy density of the optical pulse; and (c) a beam adjusting unit configured to irradiate the optical pulse to a surface of a doping-object made of silicon carbide on which an impurity-containing source-film containing impurity atoms is deposited, wherein the light source controller controls the light source to irradiate a first optical pulse to the impurity-containing source-film so as to form a reaction-product layer in the doping-object, and to irradiate a second optical pulse having an energy density higher than an energy density of the first optical pulse, so as to introduce the impurity atoms into the target through the reaction-product layer.

Another aspect of the present invention inheres in a doping method encompassing: (a) depositing an impurity-containing source-film containing impurity atoms on a top surface of a doping-object made of silicon carbide; (b) forming a reaction-product layer in the doping-object by irradiating a first optical pulse to the impurity-containing source-film; and (c) doping the impurity atoms into the doping-object through the reaction-product layer by irradiating a second optical pulse to the impurity-containing source-film, the second optical pulse having an energy density higher than an energy density of the first optical pulse.

Still another aspect of the present invention inheres in a method for manufacturing a silicon carbide semiconductor device encompassing: (a) on a surface of a semiconductor region of silicon carbide having a first conductivity type, depositing an impurity-containing source-film containing impurity atoms of a second conductivity type; (b) forming a reaction-product layer in the semiconductor region by irradiating a first optical pulse to the impurity-containing source-film; (c) doping the impurity atoms into the semiconductor region through the reaction-product layer by irradiating a second optical pulse to the impurity-containing source-film so as to form an impurity-doped region of the second conductivity type, the second optical pulse having an energy density higher than an energy density of the first optical pulse; and (d) forming a semiconductor device structure including a p-n junction between the semiconductor region and the impurity-doped region.

DETAILED DESCRIPTION

Figure 1:
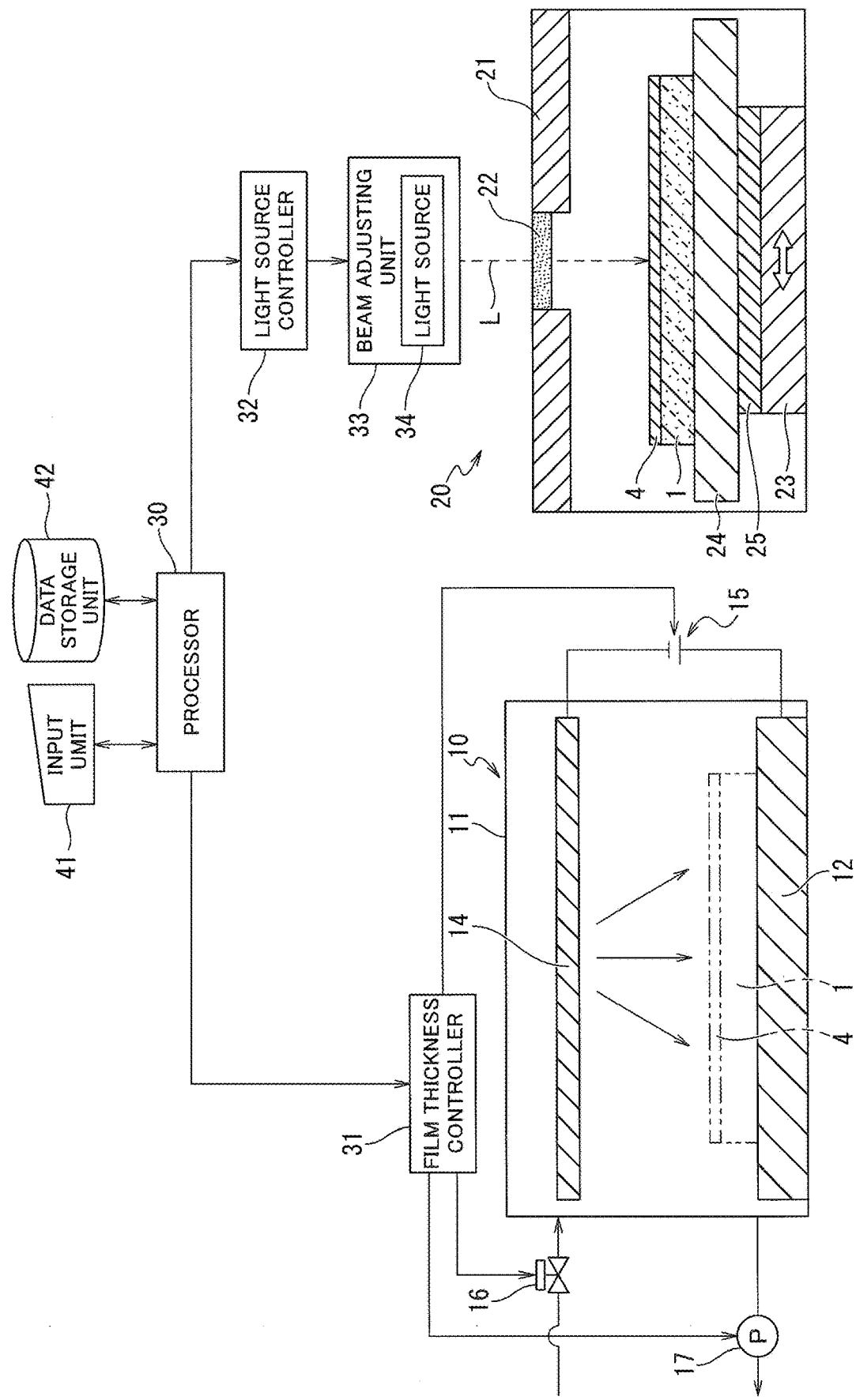
FIG. 1 is a block diagram with a cross-sectional view schematically illustrating an example of a configuration of a doping system according to a first embodiment.

First to third embodiments of the present invention will be described below with reference to the drawings. In the descriptions of the drawings to be referred, the same or similar elements are indicated by the same or similar reference numerals. It should be understood that the drawings are illustrated schematically, and relationships of thicknesses and planar dimensions, and thickness proportions of the respective devices and elements are not drawn to scale. The specific thicknesses and dimensions should be considered in accordance with the following descriptions. It should also be understood that the respective drawings are illustrated with the dimensional relationships and proportions different from each other.

In the following descriptions, the terms relating to directions, such as "left and right" and "top and bottom" are merely defined for illustration purposes, and thus, such definitions do not limit the technical spirit of the present invention. Therefore, for example, when the paper plane is rotated by 90 degrees, the "left and right" and the "top and bottom" are read in exchange. When the paper plane is rotated by 180 degrees, the "top" is changed to the "bottom", and the "bottom" is changed to the "top". Further, in the specification and the appended drawings, the mark "n" or "p" added to a region or a layer denotes that electrons or holes are majority carriers, respectively. In addition, the superscript "+" or "−" added to the mark "n" or "p" denotes that a semiconductor region has a higher or lower impurity concentration than a region without the superscript "+" or "−" added.

First Embodiment

-Doping System—

As illustrated in FIG. 1, a doping system according to a first embodiment includes a deposition apparatus 10, a light-irradiation apparatus 20, and a processor 30 connected to the deposition apparatus 10 and the light-irradiation apparatus 20.

The deposition apparatus 10 deposits an impurity-containing source-film 4 containing impurity atoms on a surface of a doping-object 1 made of a solid-state material. For the deposition apparatus 10, for example, a sputtering apparatus, an electron-beam evaporator, a chemical vapor deposition (CVD) apparatus, and the like can be adopted. In FIG. 1, a sputtering apparatus is exemplified as the deposition apparatus 10 according to the first embodiment. The deposition apparatus 10 includes a chamber 11 being capable of evacuation, and a lower electrode 12 provided in the chamber 11, on which the doping-object 1 is placed. A sputtering-target 14 containing the impurity atoms is disposed opposite to the lower electrode 12 in an upper side position in the chamber 11.

The deposition apparatus 10 further includes a power supply 15 connected between the lower electrode 12 and the sputtering-target 14, a gas-inlet valve 16 connected to the chamber 11 for supplying a rare gas, such as an argon (Ar) gas and the like, into the chamber 11. The deposition apparatus 10 further includes a vacuum pump 17, such as a rotary pump, a turbo-molecular pump, a cryopump and the like connected to the chamber 11 to evacuate the inside of the chamber 11 into a vacuum state.

A film thickness controller 31 which controls a film thickness of the impurity-containing source-film 4 is connected to the power supply 15, the gas-inlet valve 16, and the vacuum pump 17. Although illustration is omitted, the film thickness controller 31 can feedback-control the film thickness, by in-situ monitoring of a signal from a thickness meter installed in the deposition apparatus 10. The power supply 15, the gas-inlet valve 16, and the vacuum pump 17 are connected to the processor 30 via the film thickness controller 31.

In the case of the DC sputtering apparatus used as the film deposition apparatus 10 of FIG. 1, a DC voltage is applied across the lower electrode 12 and the sputtering-target 14 by the power supply 15, and the rare gas supplied through the gas-inlet valve 16 is ionized to collide with the sputtering-target 14. Then, particles of the impurity atoms ejected from the sputtering-target 14 by the collision impact and adhere on the surface of the doping-object 1 to forma film. In addition to the DC sputtering apparatus, an RF sputtering apparatus, a magnetron sputtering apparatus, an ion beam sputtering apparatus, and the like may be used as the deposition apparatus 10. The film thickness of the impurity-containing source-film 4 to be deposited can be controlled by adjusting the processing time during film deposition.

The light-irradiation apparatus 20 irradiates the doping-object 1 having a flat surface with the optical pulse L having a large energy density (irradiation fluence), such as a laser light and the like, through the impurity-containing source-film 4 so as to introduce the impurity atoms to a part inside the doping-object 1. The impurity atoms are doped in the doping-object 1 from the impurity-containing source-film 4 by the energy effect given by the optical pulse L to the impurity-containing source-film 4 and the doping-object 1. The energy effect also includes the effect of thermal energy.

The light-irradiation apparatus 20 includes a chamber 21 to place the doping-object 1 inside, and a beam adjusting unit 33 to scan and irradiate an optical pulse L onto the surface of the doping-object 1 placed in the chamber 21 via the impurity-containing source-film 4 with an irradiation area having a fixed size. The optical pulse L is irradiated through an optical window 22, which is provided on a ceiling wall of the chamber 21, the ceiling wall is assigned at a side facing to the beam adjusting unit 33.

Further, inside the chamber 21 of the light-irradiation apparatus 20, an XY-movable stage 23 is provided. The XY-movable stage 23 is a mechanism for freely moving the doping-object 1 in the X-Y direction defined within a plane parallel to the main surface of the doping-object 1 through the support base 24. A heating member 25 is provided between the XY-movable stage 23 and the support base 24. Although illustration is omitted, the heating unit 25 is connected to a power supply, and heats the doping-object 1 from the lower side through the support base 24 to raise the temperature of the doping-object 1.

Figure 3:
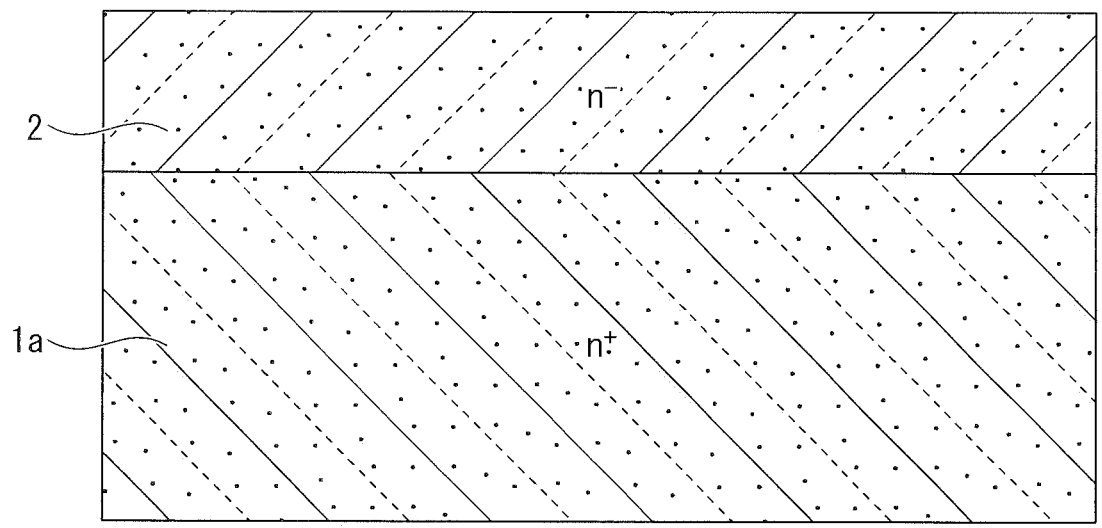
FIG. 3 is a cross-sectional view illustrating a process of the doping method according to the first embodiment (part 1)

For the doping-object 1 of doping the impurity atoms, for example, as illustrated in FIG. 3, a double-layer structure in which an epitaxial growth layer 2 of 4H-SiC is grown on an $n^+$ type semiconductor substrate $1a$ of 4H-SiC having a (0001) plane ((000-1) plane) may be used. The material of the doping-object 1 is not limited to SiC, and a wide band gap semiconductor material, such as gallium nitride (GaN), gallium oxide ($Ga_2O_3$), diamond and the like, may be also used. In addition, the material of the doping-object 1 is not limited to the wide band gap semiconductor material, and the other material, such as a semiconductor material having a forbidden bandwidth of 2.2 eV or less, an insulator material and the like, may be used.

The doping-object 1 is disposed in the light-irradiation apparatus 20 so that a top surface of the epitaxial growth layer 2 in the doping-object 1 faces the beam adjusting unit 33. A reference mark for alignment may be delineated on the top surface of the doping-object 1, although illustration is omitted.

The impurity-containing source-film 4 is a film containing the impurity atoms to be doped to the doping-object 1 as an impurity source. In the first embodiment, Al is selected as a p-type impurity element and an Al thin film containing Al or Al alloy can be used as the impurity-containing source-film 4. In addition, the impurity-containing source-film 4 is not limited to a single element film of the impurity atom itself, but may be a thin film made of a compound with another element, for example, a compound or a mixture, such as a nitride and the like, or may be a multilayered composite film and the like of the compound or the mixture. Furthermore, the impurity element is not limited to Al, and other impurity element, such as boron (B), beryllium (Be), phosphorus (P), vanadium (V) and the like, may be used as the impurity element in consideration of the conductivity type, or the crystal structure and thermodynamics of the matrix phase.

As illustrated in FIG. 1, the beam adjusting unit 33 of the doping system includes a light source 34 for emitting an optical pulse L having a large energy density, such as a laser beam and the like, and, although not illustrated, a lens for condensing the emitted laser beam, a variable slit for forming the laser beam in a predetermined shape, and the like. The beam adjusting unit 33 is connected to a light source controller 32 which controls irradiation conditions, such as an energy density, a pulse interval of the laser light to be irradiated, and the like. The light source controller 32 is connected to the processor 30, and the light source 34 of the beam adjusting unit 33 is controlled by the processor 30 through the light source controller 32.

Although not illustrated, in the beam adjusting unit 33, when necessary to sweep a laser beam, it is preferable to use another optical system, such as a reflecting mirror or a prism, which reflects the formed laser beam and guides the formed laser beam to a condensing element, such as a lens and the like. The optical pulse L having a large energy density, such as the formed laser beam, is irradiated toward the interface region between the top surface of the doping-object 1 and the impurity-containing source-film 4.

A rectangular shape is suitably used for a shape of the laser beam to be formed, but it is not limited to a rectangle, and other shapes may be used. Although not illustrated, when controlling the irradiation position of the optical pulse L on the doping-object 1, it is possible to use an imaging device such as a CCD camera and the like for imaging the reference mark of the doping-object 1, a lighting unit for emitting an illumination light, a mirror for reflecting and transmitting the illumination light and an alignment mechanism may be separately provided.

For the optical pulse L having a large energy density, a pulsed laser beam capable of imparting optical energy to the impurity atoms and the lattice vibration of the doping-object 1 is preferable so that sufficient reaction energy may be transmitted through the impurity-containing source-film 4. For example, an excimer laser having an emission wavelength of 193 nm (ArF), 248 nm (KrF), 308 nm (XeCl), 351 nm (XeF) or the like can be adopted. A penetration length (penetration depth) of the excimer laser into 4H-SiC may be around 100 nm for the KrF laser having the emission wavelength of 248 nm, about three μm for XeCl laser having the emission wavelength of 308 nm, and about 25 μm for the XeF laser having the emission wavelength of 351 nm, respectively.

For the optical pulse L, a laser having a wavelength of 266 nm of fourth harmonic of YAG laser, 355 nm of third harmonic of YAG laser, 532 nm of second harmonic of YAG laser or the like can be adopted. Alternately, a laser having a wavelength of 1.064 μm of fundamental wave of YAG laser, 10.6 μm of carbon dioxide ($CO_2$) gas laser or the like may be used in accordance with the specific property of the doping-object 1, such that the doping-object 1 has a narrow band gap, or alternatively the specific property of impurity atoms contained already in the doping-object 1. Moreover, since it is also possible to obtain the optical pulse L having the large energy density from mercury (Hg) lamp, xenon (Xe) lamp and the like, by selecting a specific wavelength range in a continuous wavelength of high-power light, using a spectroscope or a filter, the optical pulse L may not be necessarily limited to the laser pulse.

By using a laser beam having a wavelength in an ultraviolet range, it is possible to obtain not only energy exceeding the forbidden band-width of the semiconductor, but also energy exceeding the chemical potential of the surface reaction. Therefore, it is possible to optically excite the surface reaction, such as a photocatalysis, a surface migration and the like.

Furthermore, it is also possible to excite a reaction which is beyond an excitation energy of an elementary reaction (an elementary step), such as a diffusion of molecules on the surface by a mere surface migration and the like. For example, it is also possible to excite a bulk lattice vibration having a force directed toward the interior from a surface of the solid-state material, in which the impurity atoms are supposed to be doped. Thus, it is possible to assist a surface reaction including an internal reaction in the bulk lattice, the internal reaction will move the impurity atom to a dopant lattice-site or a substitution site in a doping-target of the solid-state material in the range of penetration depth of the laser beam. However, in a range of a vacuum-ultraviolet light, a shorter wavelength light than the ArF laser (wavelength of 193 nm) or the like is absorbed by oxygen molecules in the atmospheric air, and therefore, the shorter wavelength light is disturbed to propagate in the atmospheric air. Then, in an atmospheric environment, it is preferable to use a laser beam having a wavelength longer than about 190 nm.

The XY-movable stage 23 horizontally supports the support base 24 from below and is connected to a movable-stage drive-unit (not shown). By controlling the movable-stage drive-unit by the processor 30, the support base 24 freely can move in directions (X-Y directions) in a horizontal plane, and the doping-object 1 can move with ease to an irradiation position of the optical pulse L. For example, by moving the relative position of the doping-object 1 freely with respect to the irradiation position of the optical pulse L, it is possible to directly write a pattern of the impurity doping region. Furthermore, by providing a Z movable stage between the support base 24 and the XY-movable stage 23, for moving the support base 24 in a Z direction perpendicular to the X-Y directions, so that the support base 24 can move in the Z direction in addition to the X-Y directions so as to adjust the focus and the like of the optical pulse L.

The processor 30 controls deposition conditions, such as a film thickness and the like of the impurity-containing source-film 4, and irradiation conditions, such as an energy density of the laser beam, a relative irradiation position of the optical pulse L with respect to the doping-object 1 and the like. An input unit 41 and a data storage unit 42 are connected to the processor 30. The processor 30 facilitates the accessing of the data stored in the data storage unit 42. The data storage unit 42 can store kinds of the impurity atoms, or respective physical property values of various impurity atoms, each of pulse widths (irradiation times) of single pulse—single shot —, energy densities of the laser beams and the like, through the input unit 41. Further, though not shown, a display unit, an output unit and the like are connected to the processor 30.

The film thickness controller 31 controls a voltage of the power supply 15 of the deposition apparatus 10, operations of the gas introduction valve 16 and the vacuum pump 17 so as to deposit the impurity-containing source-film 4 on the target 1 with a predetermined film thickness. The light source controller 32 controls an operation of the beam adjusting unit 33 so as to scan and to irradiate the optical pulse L with predetermined values of an energy density, a number of pulses and a pulse width.

—Doping Method—

Next, a doping method according to the first embodiment, which use the doping system illustrated in FIG. 1, will be described. First, in Step S1 of FIG. 2, for example, a composite structure (1a, 2) made of a double-layer structure in which an n⁻-type 4H-SiC epitaxial growth layer 2 is grown on an n⁺-type 4H-SiC substrate 1a is prepared as the doping-object, as illustrated in FIG. 3. The epitaxial growth layer 2 being a surface layer of the doping-object has a thickness of about 5 μm to 20 μm and an impurity concentration of, for example, about $1\times10^{13}/\text{cm}^3$ to $1\times10^{16}/\text{cm}^3$.

Figure 4:
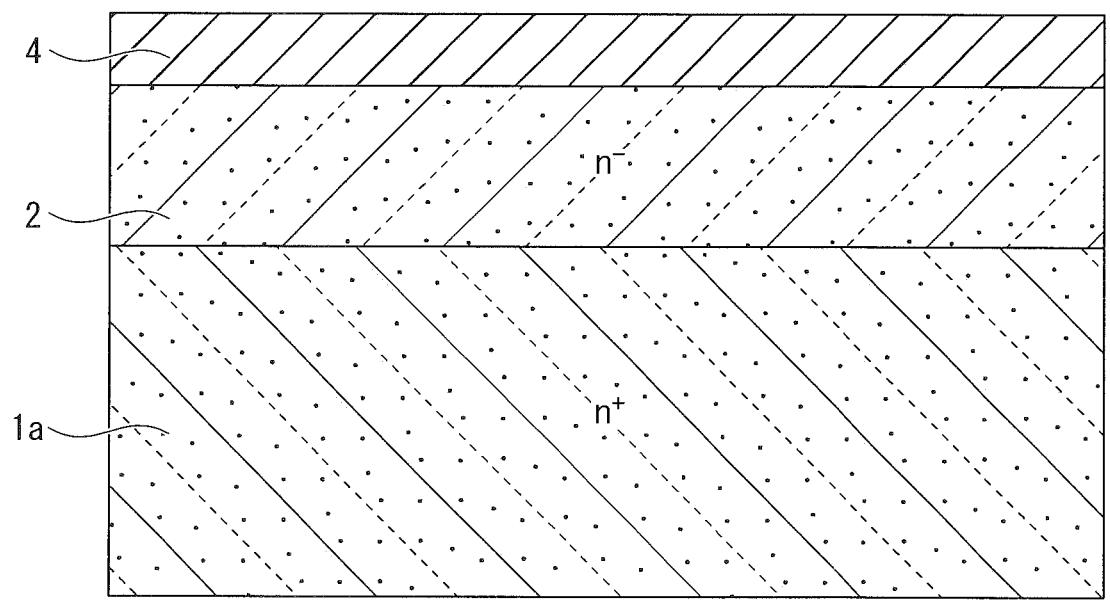
FIG. 4 is a sectional view illustrating the process of the doping method according to the first embodiment (part 2)

Next, in Step S2, as illustrated by a two-dot chain line inside the deposition apparatus 10 in FIG. 1, the semiconductor substrate 1a is placed and fixed on the lower electrode 12 so that a top surface of the composite structure (1a, 2) as the doping-object 1 is directed toward the sputtering-target 14. Then, the film thickness controller 31 of the deposition apparatus 10 controls the voltage across the lower electrode 12 and the target 14 and the operations of the gas introduction valve 16 and the vacuum pump 17, and as illustrated in FIG. 4, the impurity-containing source-film (impurity-source film) 4 made of an Al thin film is deposited on the top surface of the epitaxial growth layer 2, with a thickness of, for example, about 240 nm.

Next, the composite structure (1a, 2) on which the impurity-containing source-film 4 has been deposited is taken out from the chamber 11 of the deposition apparatus 10 and transported into the chamber 21 of the light-irradiation apparatus 20. In the camber 21 of the light-irradiation apparatus 20, the composite structure (1a, 2) is placed and fixed on the support base 24 so that the top surface of the impurity-containing source-film 4 faces the beam adjusting unit 33. The inside of the chamber 21 of the light-irradiation apparatus 20 is set to the ambient of atmospheric air at room temperature, for example about 27° C.

In addition, the composite structure (1a, 2) may be heated in advance by using the heating member 25 to raise the temperature. By irradiating the optical pulse L toward the top surface of the heated epitaxial growth layer 2, it is possible to more deeply introduce the impurity atoms into the epitaxial growth layer 2 with a higher concentration than in the case at the room temperature. However, when the impurity-containing source-film 4 is an Al thin film, it is desirable that the heating temperature is 500° C. or less in consideration of the melting point of Al.

Figure 5:
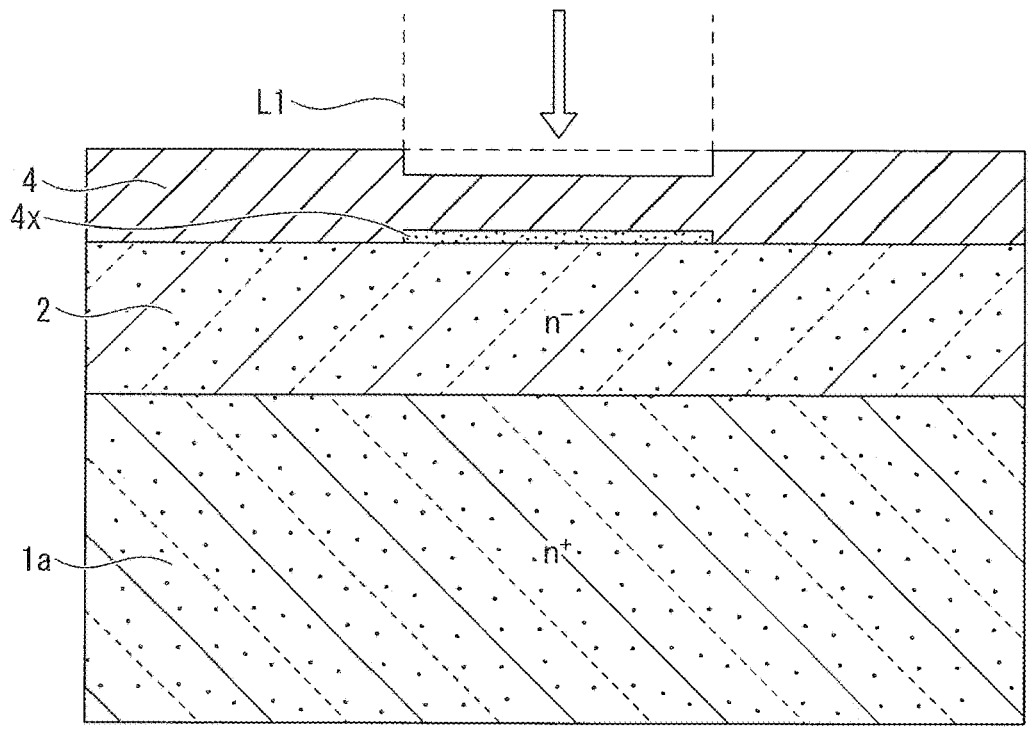
FIG. 5 is a sectional view illustrating the process of the doping method according to the first embodiment (part 3)

Next, in Step S3, the light source controller 32 of the light-irradiation apparatus 20 irradiates a first optical pulse L1 having an energy density F(1) to the impurity-containing source-film 4 on the top surface of epitaxial growth layer 2 by controlling the beam adjustment system 33, as illustrated in FIG. 5. As the first optical pulse L1, for example, a KrF excimer laser having a wavelength of 248 nm is used. The first optical pulse L1 is irradiated by shaping the beam so that the irradiation area is a square shape, for example, a planar pattern of about 350 μm square.

In the irradiated area of the impurity-containing source-film 4, the Al metal is dramatically activated and melted by the energy of the first optical pulse L1, and high-density Al plasma is generated above the irradiated area of the impurity-containing source-film 4. Then, by a part of the energy of the first optical pulse L1, a reaction product of Al and SiC including a first Al-silicide layer and the like is generated on the surface of the impurity-containing source-film 4 made of Al and the epitaxial growth layer 2 made of SiC. FIG. 5 illustrates a state in which a reaction-product layer 4x formed of the reaction product is generated on a lower portion of the impurity-containing source-film 4 overlapping with the irradiation area of the first optical pulse L1 at the interface between the impurity-containing source-film 4 and the epitaxial growth layer 2.

The energy density F(1) of the first optical pulse L1 is set to a value so as to evaporate the surface of the impurity-containing source-film. 4 by laser ablation and to remain the impurity-containing source-film 4 with a constant thickness in the irradiation area after irradiating the first optical pulse L1. Specifically, as irradiation conditions of the first optical pulse L1, when as-deposited thickness of the impurity-containing source-film 4 is about 240 nm, for example, the pulse width may be about 100 nm and the energy density F(1) may be 2.0 J/cm².

The first optical pulse L1 is irradiated in order to form the reaction-product layer 4x. Consequently, by the first optical pulse L1, the impurity-containing source-film 4 have to be ablated at a sufficient amount so as to form the reaction-product layer 4x having a size capable of sufficiently doping the impurity atoms by irradiation of a subsequent optical pulse. Therefore, it is desirable that the energy density F(1) of the first optical pulse L1 is at least about 1.0 J/cm² or more.

On the other hand, in the doping method according to the first embodiment, it is not necessary to excessively increase the ablation amount of the impurity-containing source-film 4 by the first optical pulse L1, because it is sufficient to achieve the introduction of desired impurity atoms as a whole process, which includes the irradiation of one or more subsequent optical pulses. From the viewpoint of efficient use of energy, it is desirable to reduce the energy density F(1) of the first optical pulse L1 to about 3.0 J/cm² or less.

Figure 2:
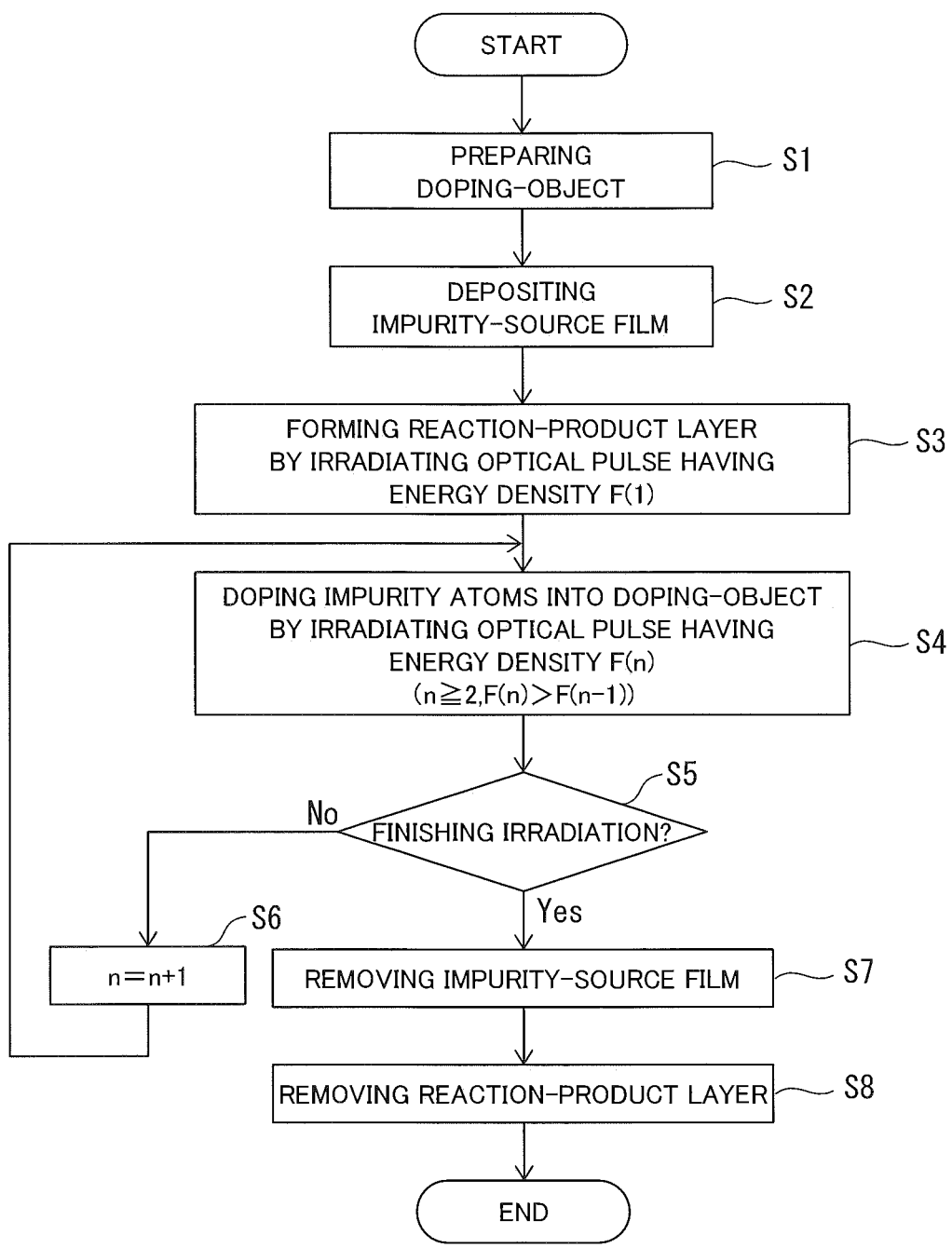
FIG. 2 is a flowchart illustrating an example of a doping method according to the first embodiment.
Figure 6:
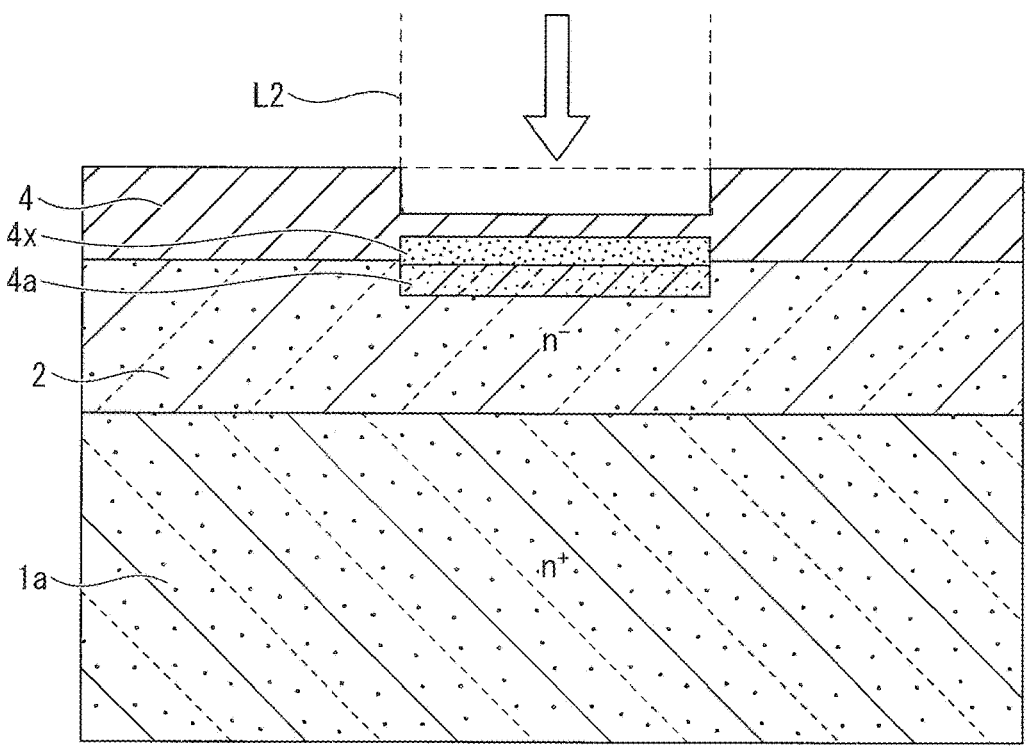
FIG. 6 is a sectional view illustrating the process of the doping method according to the first embodiment (part 4)

Next, in Step S4, as illustrated in FIG. 6, the light source controller 32 of the light-irradiation apparatus 20 irradiates a second optical pulse L2 having an energy density F(2) to the impurity-containing source-film 4 on the upper side of the reaction-product layer 4x. The Al metal is evaporated by laser ablation in the irradiated area of the impurity-containing source-film 4, and the Al metal is dramatically activated and melted by the energy of the second optical pulse L2 as in the case of the first optical pulse L1, and high-density Al plasma is generated above the irradiated area of the impurity-containing source-film 4. It is noted that "n" in FIG. 2 denotes a number of irradiations of optical pulses, and the value of "n" in FIG. 2 is equal to or larger than two.

Here, as in the case of the preceding first optical pulse L1, the reaction product of Al and SiC including a second Al-silicide layer and the like is further generated by the energy of the following second optical pulse L2. Simultaneously, the reaction between the first Al-silicide layer and the SiC crystal, the first Al-silicide layer has already been formed by the irradiation of the first optical pulse L1 in the reaction-product layer 4x, is further enhanced. At the same time, the reaction-product layer 4x performs a function similar to a "cap" for preventing desorption of Si atoms, the desorption of Si atoms occurs on the SiC surface in a high temperature state in the irradiation area. As a result, the entire thickness of the reaction-product layer 4x is increased, and the Al atoms are doped as the impurity atoms into the SiC epitaxial growth layer 2 through the reaction-product layer 4x to form an impurity-doped region 4a.

The energy density F(2) of the second optical pulse L2 is set to a value so as to evaporate the surface of the impurity-containing source-film 4 by the laser ablation and to dope the impurity atoms into the epitaxial growth layer 2 through the reaction-product layer 4x. Specifically, as irradiation conditions of the second optical pulse L2, the pulse width may be about 100 nm and the energy density F(2) may be about 4.0

J/cm². The energy density F(2) of the second optical pulse L2 is larger than the energy density F(1) of the first optical pulse L1. In consideration of irradiating a third optical pulse after irradiation of the second optical pulse L2, the energy density F (2) of the second optical pulse L2 illustrated in FIG. 6, is set so as to remain the impurity-containing source-film 4 with a constant thickness in the irradiation area.

Next, in Step S5, it is determined whether the doping of the impurity atoms has be sufficiently achieved and irradiation of an optical pulse will be finished. The determination can be made based on whether the impurity-containing source-film 4 remains in the irradiation area with a sufficient amount usable for subsequent laser ablation. For example, by visually checking the surface of the irradiated area, it may be determined that the impurity-containing source-film 4 has almost disappeared by using the change in the color of the surface to a certain extent. Alternatively, a total number of irradiations "n" of the optical pulse and the energy density F(n) of each irradiation may be preset using the results of previous simulations and experiments. Here, "n" is a positive integer of two or more.

Figure 7:
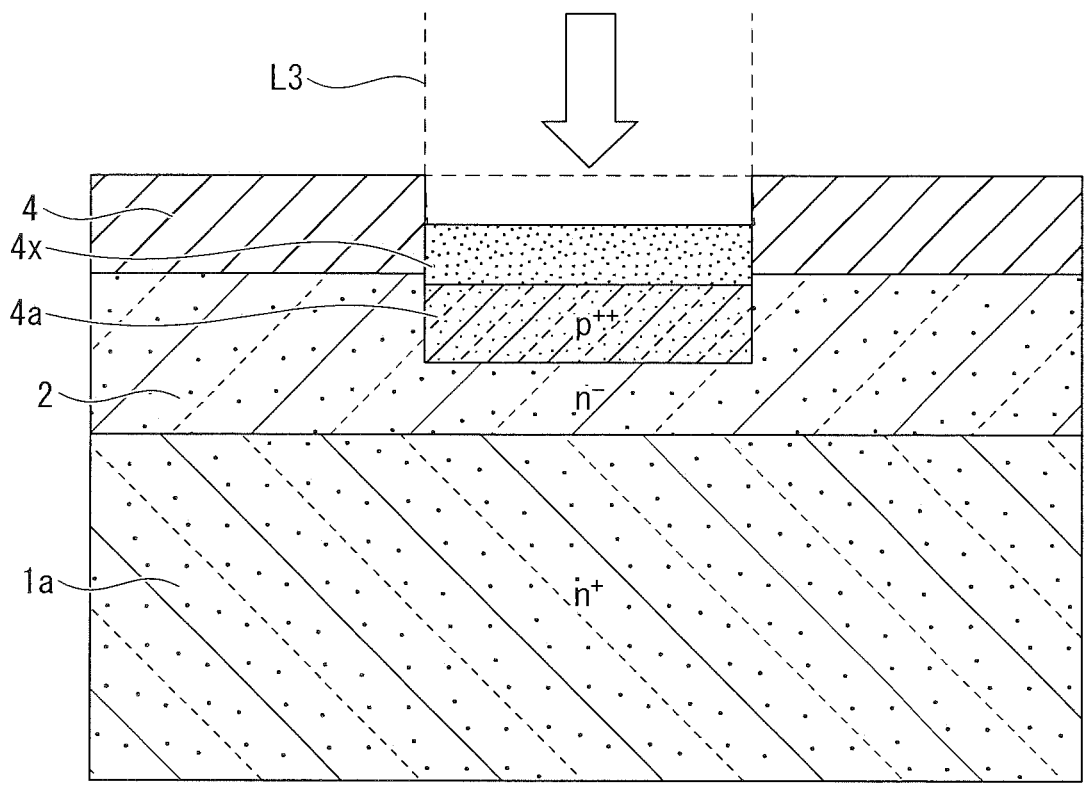
FIG. 7 is a sectional view illustrating the process of the doping method according to the first embodiment (part 5)

When continuing irradiation of subsequent optical pulse to the same irradiation position without finishing the irradiation process, the process proceeds to Step S6 in FIG. 2, where the value of "n" is incremented by one (n=n+1). Here, the value of "n" in FIG. 2 changes to "three". Then, the process returns again to Step S4, and as illustrated in FIG. 7, a third optical pulse L3 having a higher energy density F(3) is irradiated to the impurity-containing source-film 4 on the upper side of the reaction-product layer 4x on the surface of the epitaxial growth layer 2.

The energy density F(3) of the third optical pulse L3 is set to a value, for example, about 6.0 J/cm² which is larger than the energy density F(2) of the second optical pulse L2 which is 4.0 J/cm². By the energy of the third optical pulse L3, the Al metal is evaporated by laser ablation in the irradiated area of the impurity-containing source-film 4, and the Al metal is dramatically activated and melted as in the case of the first optical pulse L1 or the second optical pulse L2, and high density plasma is generated above the irradiated area of the impurity-containing source-film 4.

Then, by the energy of the third optical pulse L3, the reaction between the Al-silicide layer in the reaction-product layer 4x and the SiC crystal is further enhanced, and more Al atoms are more deeply introduced into the SiC crystal. That is, when considering the inside of the impurity-doped region 4a, the Al atoms are further doped into the upper region of the impurity-doped region 4a on the interface side with the reaction-product layer 4x by the energy of the third optical pulse L3 through the reaction-product layer 4x. Simultaneously, in the region of the impurity-doped region 4a below the interface between the impurity-doped region 4a and the epitaxial growth layer 2, the doped Al atoms diffuse downward and the impurity-doped region 4a may expand.

As described in the cases of setting the energy densities of the second optical pulse L2 and the third optical pulse L3, respectively, the optical pulse Ln used in the doping method according to the first embodiment is set to satisfy a specific condition. That is, the specific condition is F(n)>F(n−1), where the energy density F(n) of each of the optical pulses Ln irradiated plural times for the same irradiation position is larger than the energy density F(n−1). As described above, in the doping method according to the first embodiment, the multistage irradiation in which the optical pulses Ln are irradiated plural times, and the energy-increment scheme in which the energy densities in series of irradiations are stepwise increased, are combined.

However, as long as the impurity atoms can be doped through the reaction-product layer 4x, the subsequent optical pulse may have the same value as the immediately preceding optical pulse. More specifically, in a sequence of optical pulses, as long as the gradual increase of energy (herein after called "the energy-increment scheme") is established through the process from the first to the last optical pulses as a whole, it does not strictly demand that the subsequent light pulse be always larger than the immediately preceding light pulse.

In addition, as the value of the energy density F(n) increases, the doping of the Al atoms from the reaction-product layer 4x including Al, Al-silicide layer and the like is enhanced, but at the same time, precipitation of excess carbon (C), or degree of surface roughness due to the irradiation damage increases. Therefore, the maximal value in the series of energy densities F(n) of the optical pulses Ln in multiple irradiations may be set to about 6.0 J/cm² or less.

Figure 8:
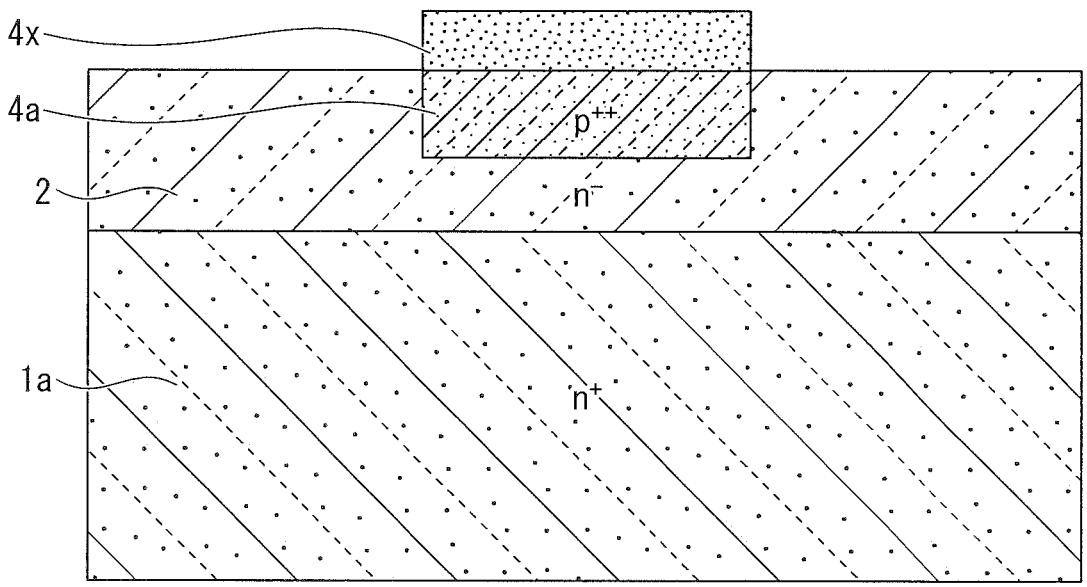
FIG. 8 is a sectional view illustrating the process of the doping method according to the first embodiment (part 6)

After the irradiation process of the n-th optical pulse Ln is executed in Step S4, the process proceeds to Step S5 again. In Step S5, when it is determined that doping of the Al atoms may be sufficiently achieved and irradiation of the optical pulses Ln may be finished, then, in Step S7, as illustrated in FIG. 8, the unnecessary impurity-containing source-film 4 which remains on the surface of the epitaxial growth layer 2 of the composite structure (1a, 2) is removed. In order to remove the impurity-containing source-film 4, for example, a hydrochloric acid (HCl) solution heated to about 80° C. can be used.

Figure 9:
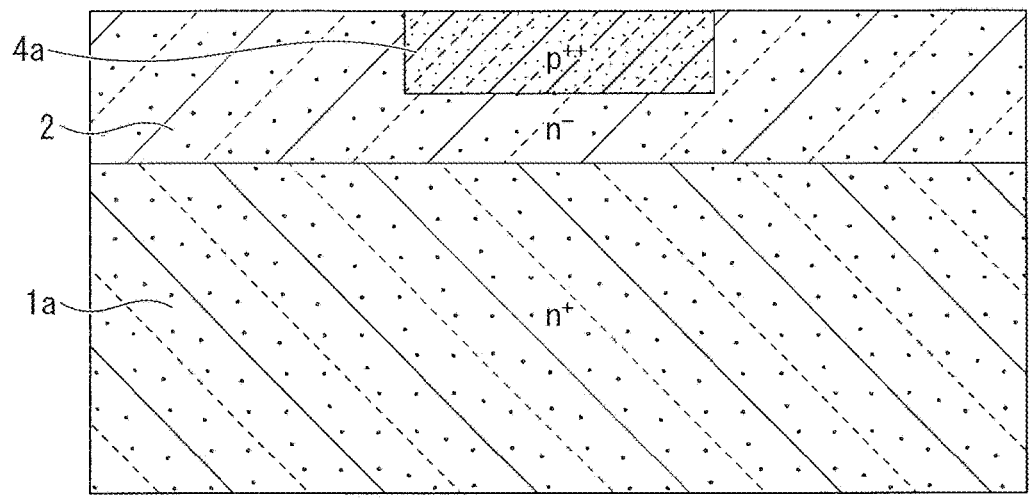
FIG. 9 is a sectional view illustrating the process of the doping method according to the first embodiment (part 7)

Next, in Step S8, as illustrated in FIG. 9, the unnecessary reaction-product layer 4x which remains on the surface of the epitaxial growth layer 2 is removed, whereby the doping method according to the first embodiment is completed. In order to remove the reaction-product layer 4x, the surface of the epitaxial growth layer may be treated, for example, by plasma etching using a tetrafluoromethane ($CF_4$) gas for about 20 minutes.

Figure 10:
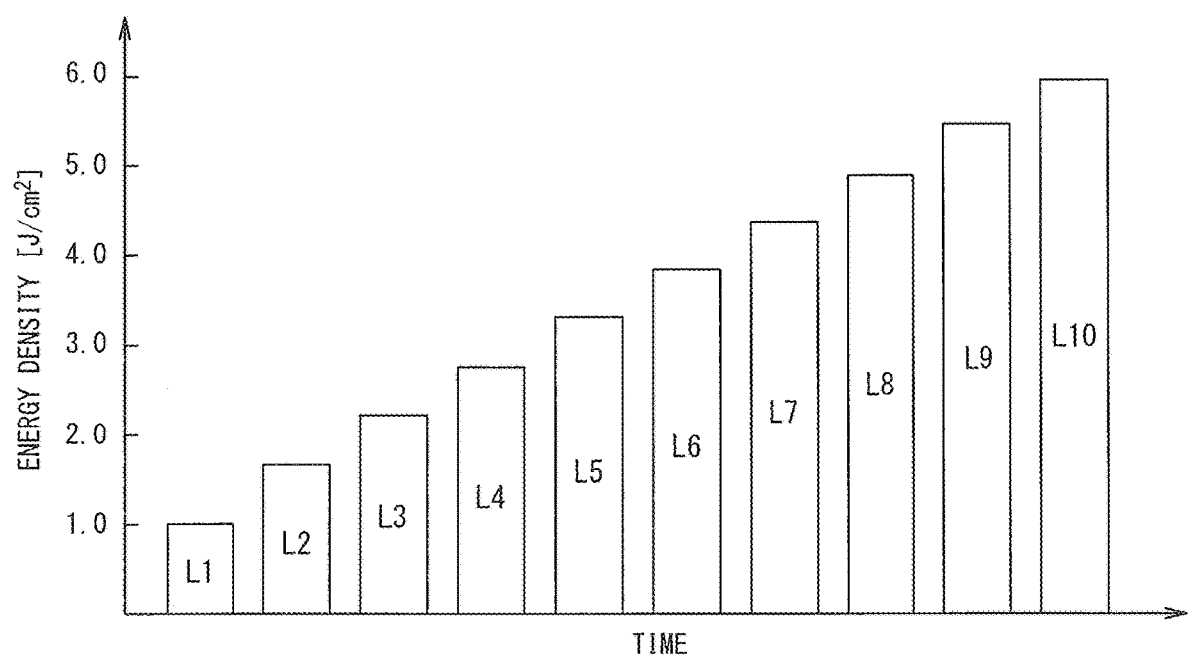
FIG. 10 is a graph illustrating each energy density of a plurality of optical pulses irradiated to an example by using the doping method according to the first embodiment.
Figure 11:
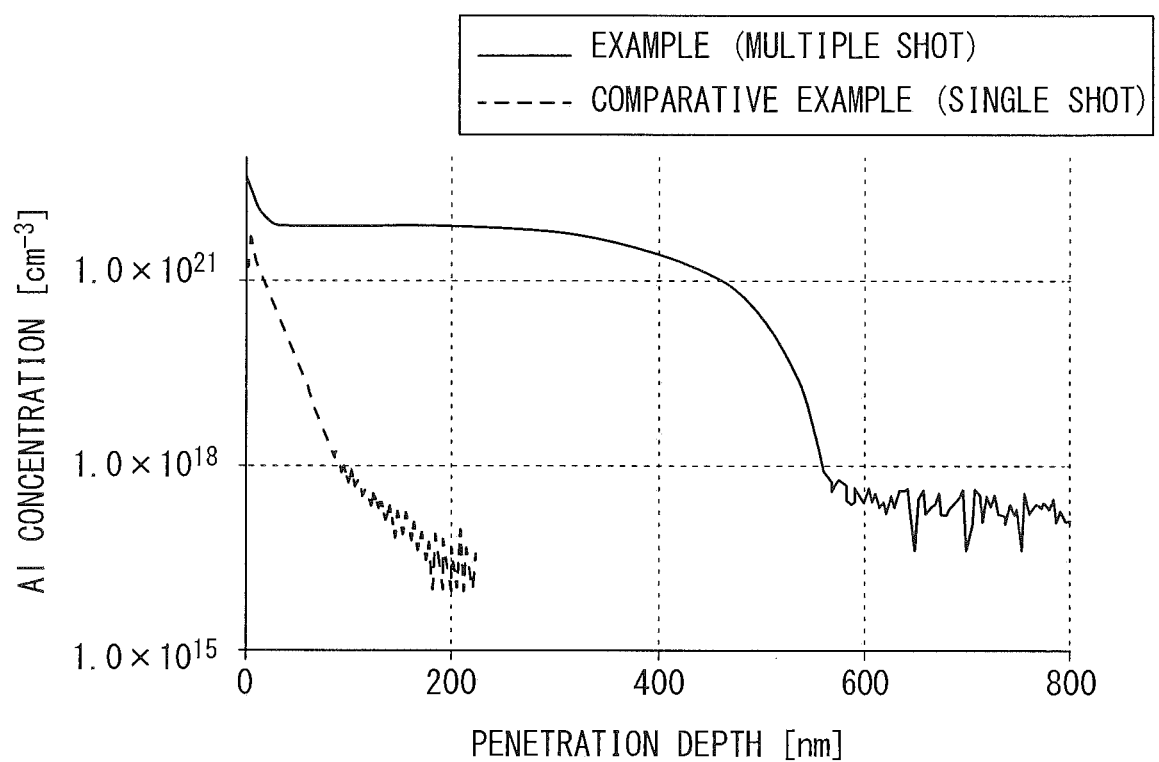
FIG. 11 is a graph illustrating an impurity-atom profile in a semiconductor substrate obtained in the example.

By irradiating optical pulses of 308 nm, from XeCl excimer laser with 10 shots, to the same irradiation position by applying the doping method according to the first embodiment, an exemplified sample has been fabricated as an example of the first embodiment. Each pulse width of the optical pulses has been about 100 nm, and each pulse interval has been set to about two to three seconds. As illustrated in FIG. 10, the energy density F(1) of the first optical pulse L1 has been about 1.0 J/cm², and the energy densities F (n) of the following optical pulses Ln after the second optical pulse L2 have been stepwise increased and the energy density F(10) of the last tenth optical pulse L10 has been set to about 6.0 J/cm². FIG. 11 illustrates the results of measuring the penetration depth of Al in the exemplified sample pertaining to the first embodiment by secondary ion mass spectrometry (SIMS).

As illustrated in FIG. 11, in the exemplified sample pertaining to the doping method according to the first embodiment, it is understood that the Al atoms can be doped at a high concentration of about $1.0 \times 10^{21}$/cm³ or more from the outermost surface of the epitaxial growth layer 2 to a depth of about 400 nm. Further, it is also understood that the Al atoms can be doped at a high concentration of about $1.0 \times 10^{18}$/cm³ or more even in a range of depth of about 400 nm to about 600 nm from the outermost surface of the epitaxial growth layer 2. Furthermore, even in a range of depth of about 600 nm to about 800 nm from the surface of the epitaxial growth layer 2, the Al atoms can be doped at a high concentration of about $1.0\times10^{17}/cm^3$ to $1.0\times10^{18}/cm^3$.

On the other hand, as a comparative example, a doping method for introducing the Al atoms by irradiation with a single shot of optical pulse L with the energy density being maximized, without combining the multistage irradiation with the energy-increment scheme has been tried. In the trial-sample of the comparative example, an Al thin film was deposited on the same semiconductor substrate with the same film thickness as the exemplified sample of the first embodiment, and other conditions than the irradiation condition of the optical pulse L have been set to be same as the exemplified sample of the first embodiment. In the case of the trial-sample of the comparative example, as illustrated in FIG. 11, although the Al atoms can be doped at a high concentration of about $1.0\times10^{21}/cm^3$ on the outermost surface of the epitaxial growth layer 2, the doping concentration of Al sharply decreases as the depth from the outermost surface increases, and the maximal dopant penetration depth also reaches only about 200 nm from the surface of the epitaxial growth layer 2.

In the doping method according to the first embodiment, the multistage irradiation is carried out with the first stage, the second stage and the third stage using the optical pulses L1, 12, L3 with respect to the same irradiation position. Further, the energy-increment scheme is carried out so that the subsequent optical pulse is continuously irradiated after the immediately preceding optical pulse with the energy density larger than the energy density of the immediately preceding optical pulse, and the energy density of the series of optical pulses is controlled to be stepwise increased. The energy density F(n) of the subsequent optical pulse Ln in the multistage irradiation becomes larger than the energy density F(n-1) of the immediately preceding optical pulse L(n-1). Thus, in every irradiation, it is possible to reliably form the reaction-product layer 4x under the Al impurity-containing source-film 4 and to perform laser doping through the reaction-product layer 4x. Consequently, it is possible to deeply introduce the Al atoms with high concentration into the inside of the SiC substrate having a very small diffusion coefficient of the impurity element.

In particular, SiC is a wide band gap semiconductor material having an extremely small diffusion coefficient of the impurity element. For example, the solid solubility of Al to 4H-SiC is about $1\times10^{20}/cm^3$. Therefore, as in the trial-sample of the comparative example illustrated in FIG. 11, it has been very difficult to dope impurity atoms to a position deeper than 200 nm from the surface of the SiC substrate by the conventional doping method. However, in the doping method according to the first embodiment, the Al atoms can be doped at a high concentration corresponding to a level of the solid solubility of 4H-SiC also to a position deeper than 200 nm or more from the surface of the SiC substrate.

Further, in the trial-sample of the comparative example using the method in which the impurity atoms are doped by irradiation with a high energy density, it is required to provide a light-irradiation apparatus capable of emitting a light with high energy, resulting in increases in apparatus-size and production-cost of the light-irradiation apparatus. However, in the doping system according to the first embodiment, even when the energy of the optical pulse used for laser doping is reduced, the impurity atoms can be deeply doped at high concentration. Therefore, it is possible to make the apparatus-size of the light-irradiation apparatus 20 smaller and to decrease the production-cost of the light-irradiation apparatus 20.

Moreover, as in the trial-sample of the comparative example where the single shot of the irradiation is used with the high energy density, it is difficult to widen the irradiation area per optical pulse L. Therefore, from the viewpoint of the irradiation process applied to the entire substrate surface, the time required for irradiating the optical pulse L is relatively long, resulting in a problem that the overall productivity is deteriorated. However, in the doping system according to the first embodiment, even when a lower value than the maximal value of the energy density is used without setting the energy density of the optical pulse L to the maximal value, it is possible to deeply dope the impurity atoms at a high concentration by the multistage irradiation with the energy-increment scheme. Therefore, since it is possible to secure a wide irradiation area of an optical pulse and to shorten the time required for irradiation of the laser light to the entire substrate surface, the overall productivity can be enhanced.

Moreover, in the trial-sample of the comparative example, because the optical pulse is irradiated at the maximized energy density, most of the Al thin film is evaporated by the laser ablation with the single shot of the irradiation. As a result, the amount of Al thin film remaining on the substrate surface is decreased, and the Al supply for the second and subsequent irradiation will be insufficient. Therefore, there is a problem that the doped concentration and the penetration depth will be immediately saturated, even if multiple irradiation is executed.

However, in the doping system according to the first embodiment, the multistage irradiation using multiple shots of the irradiation is started to form the reaction-product layer 4x from irradiating the first optical pulse L1 having the relatively small energy density F (1). Since the surface of the impurity-containing source-film 4 is substantially flat at the time of irradiation with the first optical pulse L1, although the impurity-containing source-film 4 is most likely to evaporate at the first irradiation, unnecessary ablation of the Al film is largely prevented, because the energy density F(1) of the first optical pulse L1 is reduced to a low level. Then, with the subsequent optical pulse, in the process of the doping of the impurity atoms into the SiC substrate through the reaction-product layer 4x, simultaneously, the impurity-doped region 4a can be further enlarged along with the enlargement of the reaction-product layer 4x. Thus, also in the irradiation of the second and subsequent optical pulses Ln, the use efficiency of Al film increases and excessive ablation can be prevented.

As mentioned above, in the doping method according to the first embodiment in which the multistage irradiation and the energy-increment scheme are combined, it is possible to perform the laser doping with suppressing the material cost by remarkably decreasing the loss of the Al film, and to markedly increase the doping concentration and the penetration depth of Al than the conventional doping method.

—Method for Manufacturing Semiconductor Device—

In the manufacturing method of the semiconductor device according to the first embodiment, first, the composite structure (1a, 2) shown in FIG. 3 in which the n⁻-type epitaxial growth layer 2 is grown on the n⁺-type SiC substrate 1a, is prepared as the doping-object. That is, the doping-object has a structure in which double SiC semiconductor layers are stacked. Then, the multistage irradiation with the energy-increment scheme of the optical pulse Ln as described in the doping method according to the first embodiment are executed to prepare an exemplified sample in which the impurity-doped region 4a is selectively formed as illustrated in FIG. 9.

Figure 12:
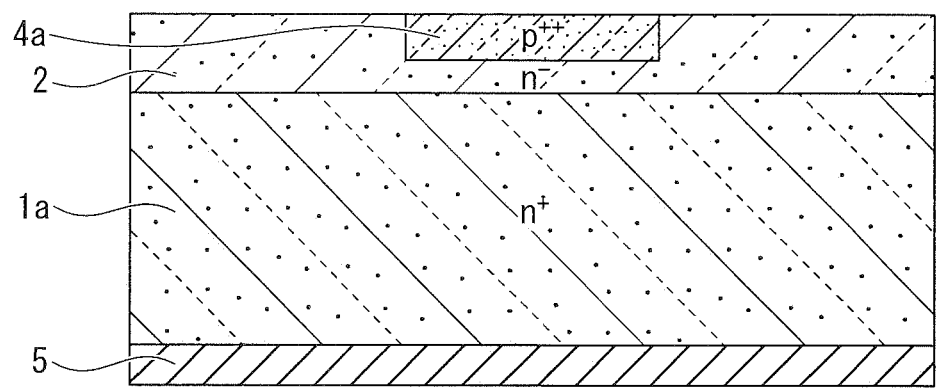
FIG. 12 is a cross-sectional view illustrating a process of a manufacturing method of a semiconductor device according to the first embodiment (part 1)
Figure 13:
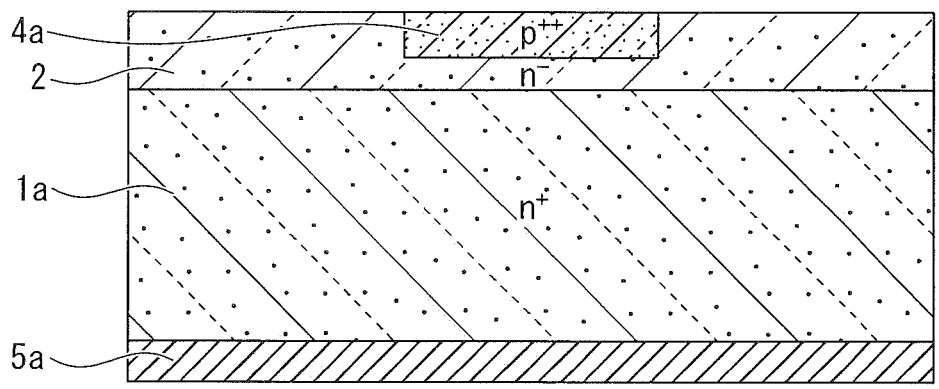
FIG. 13 is a cross-sectional view illustrating the process of the manufacturing method of the semiconductor device according to the first embodiment (part 2)

Next, as illustrated in FIG. 12, a thin metallic film of, for example, nickel (Ni) or the like is deposited by sputtering method, vacuum evaporation method, CVD method and the like on the entire bottom surface which is the back surface of the semiconductor substrate 1a, as a contact seed layer 5 to a thickness of about 50 nm. Next, the contact seed layer 5 is heated to at least about 1000° C. to cause a silicide reaction between SiC and Ni, thereby forming a Ni silicide layer as an ohmic-contact layer 5a on the back surface of the semiconductor substrate 1a as illustrated in FIG. 13. As a result, a p-n junction between the n-type epitaxial growth layer 2, and the p-type impurity-doped region 4a is formed. Therefore, a p-n junction diode including an n-type semiconductor layer implemented by the semiconductor substrate 1a and the epitaxial growth layer 2, and a p-type semiconductor layer being the impurity-doped region 4a is formed.

Figure 14:
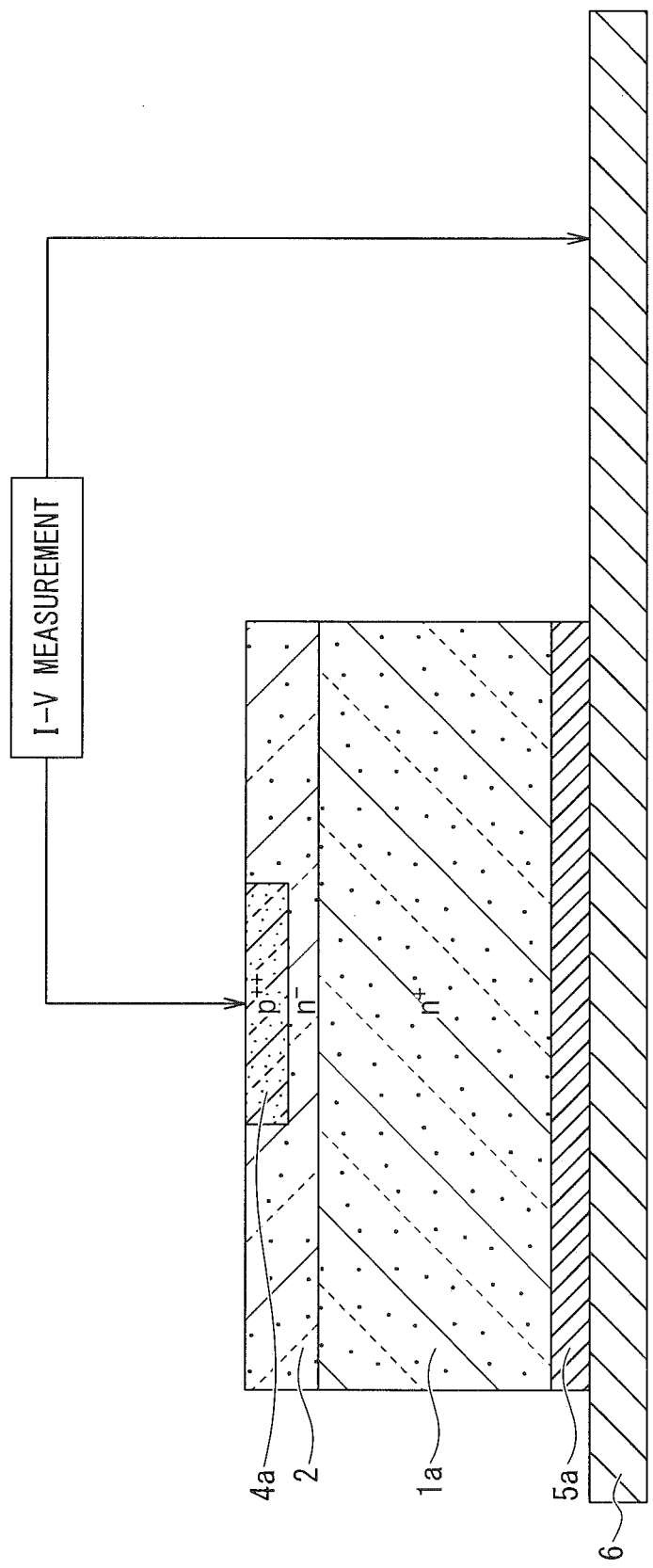
FIG. 14 is a cross-sectional view illustrating how to measure current-voltage characteristics of a p-n junction-diode formed by the manufacturing method of the semiconductor device according to the first embodiment.
Figure 15:
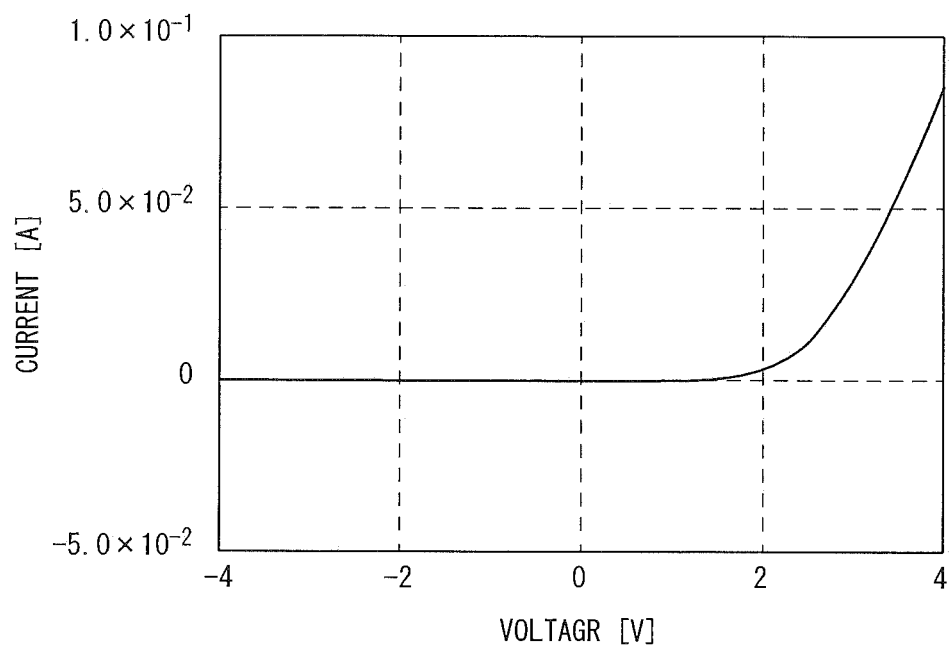
FIG. 15 is a graph showing I-V characteristics of the p-n junction-diode in the semiconductor substrate, obtained by using the measurement system of FIG. 14.

As illustrated in FIG. 14, the diode illustrated in FIG. 13 is placed on a stage 6 made of metal and a probe needle is brought into contact with the top surface of the impurity-doped region 4a so as to measure a current between the top surface side of the semiconductor substrate 1a and the stage 6. As illustrated in FIG. 15, when a positive voltage is applied to the top surface side of the semiconductor substrate 1a, a current flows, but no current flows when a negative voltage is applied. When the positive voltage is about one volts, almost no current flows, and thus it can be understood that the flowing current is not due to the Schottky contact between the impurity-doped region 4a and the probe needle. On the other hand, as illustrated in FIG. 15, the current starts to flow abruptly when the applied voltage exceeds two volts. Considering the built-in voltage of SiC of about 2.4 volts, it can be understood that a p-type layer is selectively formed on the top surface side of the n-type semiconductor substrate 1a and a p-n junction is formed.

In addition, in the doping method according to the first embodiment, since the impurity-doped region 4a is doped at a high concentration, an effective ohmic contact is achieved on the upper portion of the impurity-doped region 4a by point-contact configuration. However, it is also possible to form a metallurgical ohmic contact by depositing an anode electrode film, such as a Ni film, a titanium (Ti) film, an Al film, a laminated film of Ni, Ti and Al, and the like, on the impurity-doped region 4a.

In the method of manufacturing a semiconductor device using the doping method according to the first embodiment, the Al atoms are doped at a high concentration into the SiC substrate which has a very small diffusion coefficient of the impurity element, so that a semiconductor device with a higher quality can be manufactured. In addition, by suppressing excessive ablation of Al film and efficiently using the impurity-containing source-film 4, the manufacturing cost of the semiconductor device can be decreased.

Second Embodiment

—Method for Manufacturing Semiconductor Device—

Figure 16:
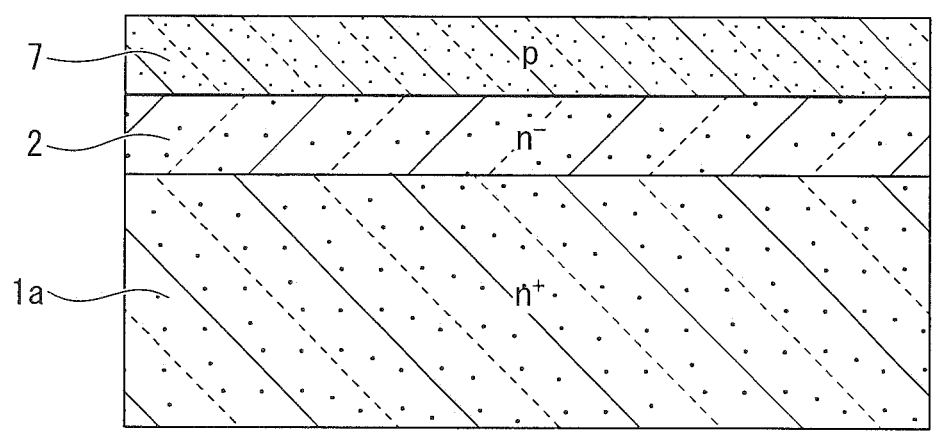
FIG. 16 is a cross-sectional view illustrating a process of a manufacturing method of a semiconductor device according to a second embodiment (part 1)

As illustrated in FIG. 16, a method of manufacturing a semiconductor device according to a second embodiment is different from the first embodiment in that a doping-object to be prepared first is a composite structure (1a, 2, 7) in which triple SiC semiconductor layers are laminated. In the composite structure (1a, 2, 7), an n$^-$-type epitaxial growth layer 2 is grown on an n$^+$-type SiC substrate 1a, and a p-type base layer 7 is provided on the epitaxial growth layer 2. Since a doping method according to the second embodiment and a doping system used for the doping method are equivalent to those in the first embodiment, redundant description will be omitted.

Figure 17:
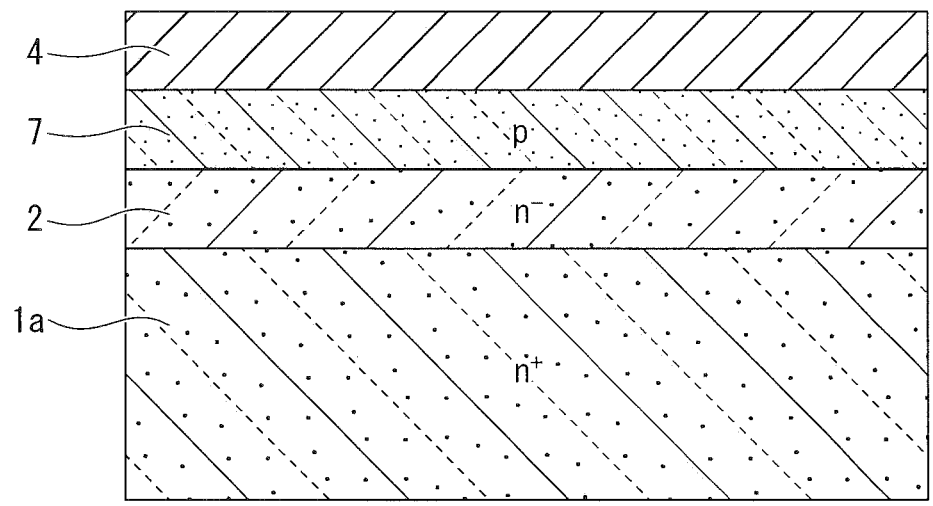
FIG. 17 is a cross-sectional view illustrating the process of the manufacturing method of the semiconductor device according to the second embodiment (part 2)
Figure 18:
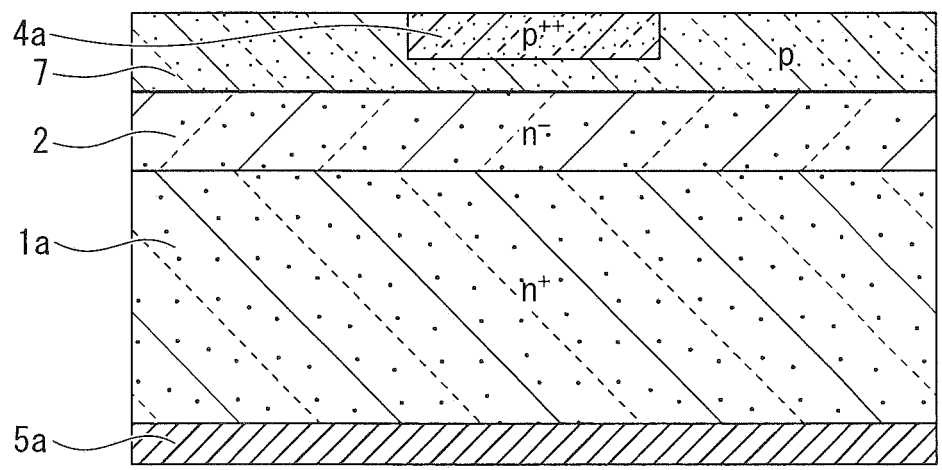
FIG. 18 is a cross-sectional view illustrating the process of the manufacturing method of the semiconductor device according to the second embodiment (part 3)

Next, as illustrated in FIG. 17, an impurity-containing source-film 4 is deposited on the base layer 7 in the same manner as in the case described with reference to FIG. 4. Subsequently, similarly to the case described with reference to FIGS. 5 to 9, the doping method is executed, and the impurity-doped region 4a is formed as a base contact region by the multistage irradiation with multiple optical pulses Ln and the energy-increment scheme. Next, as in the case of the method of manufacturing the semiconductor device according to the first embodiment, a thin metallic film of Ni or the like is deposited on the bottom surface which is the back surface of the semiconductor substrate 1a by sputtering method, vacuum evaporation method, CVD method and the like, as a contact seed layer. Next, by heating the composite structure (1a, 2, 7) with the contact seed layer to about 1000° C., a Ni silicide layer is formed as an ohmic-contact layer 5a on the back surface of the semiconductor substrate 1a as illustrated in FIG. 18.

In the method of manufacturing the semiconductor device according to the second embodiment, it is possible to achieve the semiconductor device having the base contact region which is formed on the top surface side of the semiconductor substrate 1a in the base layer 7, with a concentration higher than that of the base layer 7. The other effectiveness of the method of manufacturing the semiconductor device according to the second embodiment are the same as those of the first embodiment.

Third Embodiment

—Method for Manufacturing Semiconductor Device—

Figure 19:
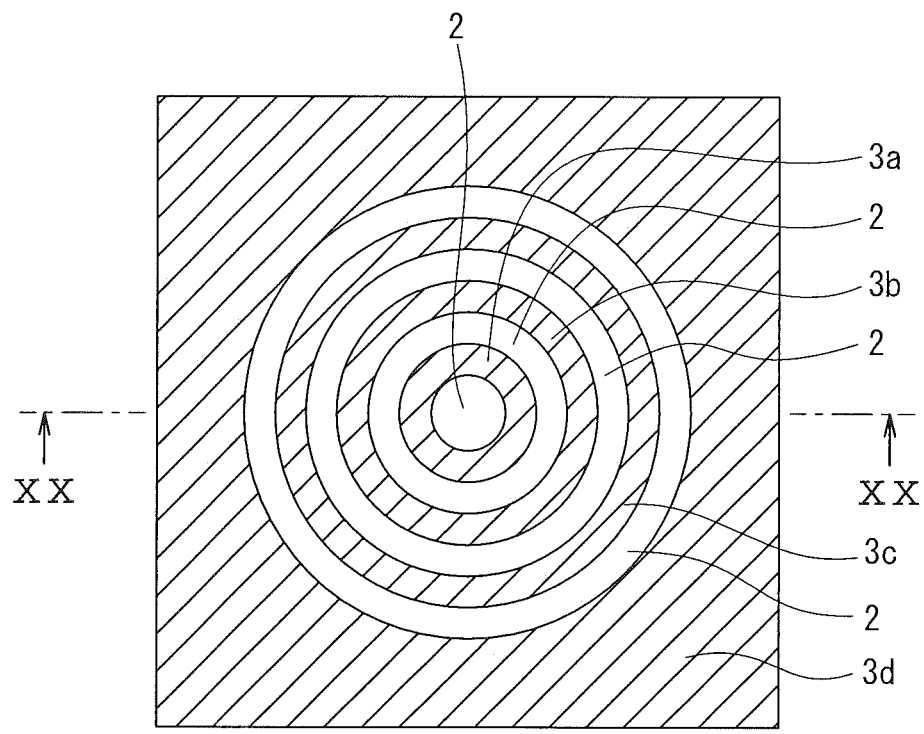
FIG. 19 is a top view illustrating a process of a manufacturing method of a semiconductor device according to a third embodiment (part 1)

A method of manufacturing a semiconductor device according to a third embodiment, as illustrated in FIG. 19, is different from the first and second embodiments in that the semiconductor device is manufactured with delineating a selective doping mask (3a, 3b, 3c, 3d) on a top surface of an SiC epitaxial growth layer 2. In the method for manufacturing the semiconductor device according to the third embodiment, an Al film as an impurity-containing source-film 4 is deposited on the epitaxial growth layer 2 having the selective doping mask (3a to 3d), and an doping method is performed. Since the doping method and the doping system used for the doping method according to the third embodiment are equivalent to those of the first embodiment, duplicate description will be omitted.

In the method for manufacturing the semiconductor device according to the third embodiment, first, a composite structure (1a, 2) in which the n$^-$-type epitaxial growth layer 2 is grown on the n$^+$-type SiC substrate 1a as illustrated in FIG. 3, are prepared as a doping-object. Thereafter, an doping-block film made of a material having a high introduction blocking capability of impurity atoms, such as a silicon oxide film (SiO$_2$) and the like, is deposited on the top surface of the epitaxial growth layer 2, for example, with a thickness of about 1 μm by plasma-enhanced CVD (PECVD).

Then, a photoresist film is coated on the doping-block film, and the coated photoresist film is delineated by a photolithography technique. Using the delineated photoresist film as an etching mask, the doping-block film is etched to form patterns of the selective doping mask (3a to 3d) having the planar shape illustrated in FIG. 19. In FIG. 19, the selective doping mask (3a to 3d) are indicated by shaded regions for convenience of explanation.

When the SiO$_2$ film is used as the doping-block film, the SiO$_2$ film is selectively etched using, for example, buffered hydrofluoric acid (BHF) which is an aqueous solution containing ammonium fluoride (NH$_4$F) and hydrofluoric acid (HF), to cut a window portion (opening portion) for selective doping of the impurity atoms. As a result, a ring-shaped first doping-block pattern 3a, a ring-shaped second doping-block pattern 3b, a ring-shaped third doping-block pattern 3c, and a fourth doping-block pattern 3d which surrounds the third doping-block pattern 3c is left as the selective doping mask (3a to 3d).

The first doping-block pattern 3a is disposed so as to surround a circular window portion at the center of a top surface of the epitaxial growth layer 2. The second doping-block pattern 3b is disposed concentrically with the first doping-block pattern 3a, so as to provide a gap serving as a window portion with the first doping-block pattern 3a. The third doping-block pattern 3c is disposed concentrically with the first doping-block pattern 3a and the second doping-block pattern 3b, so as to provide a gap serving as a window portion with the second doping-block pattern 3b. A side wall on an inner edge side of the fourth doping-block pattern 3d appears concentrically with the first doping-block pattern 3a to the third doping-block pattern 3c.

Figure 20:
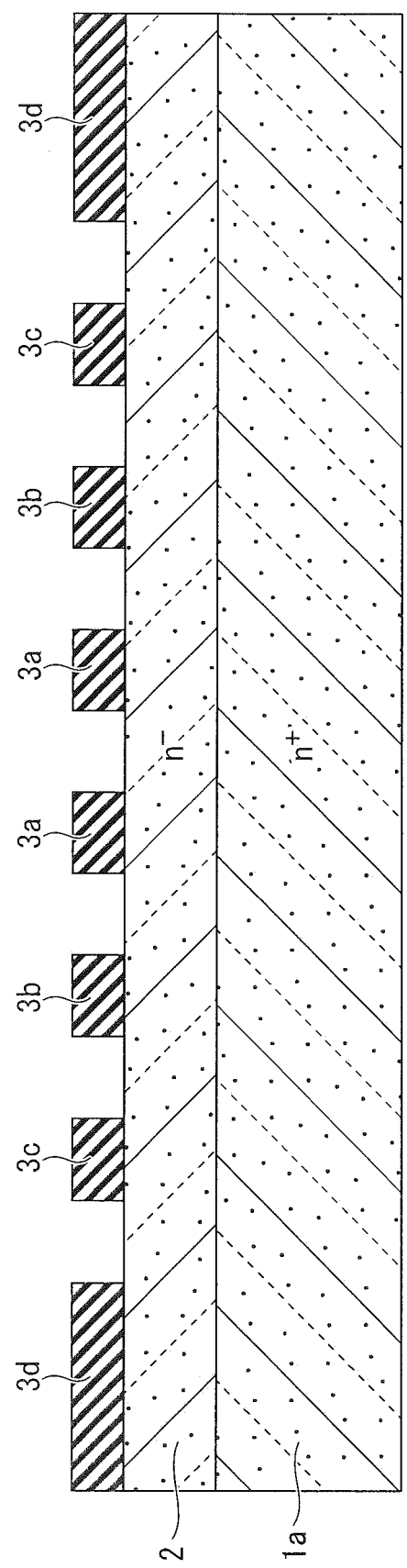
FIG. 20 is a cross-sectional view taken along line XX-XX in FIG. 19.

The first doping-block pattern 3a to the fourth doping-block pattern 3d implement an doping-protection layer for selectively blocking the doping of the impurity atoms and define the window portions. As illustrated in FIG. 20, a part of the top surface of the epitaxial growth layer 2 is exposed in the respective gaps. Every gaps between the first doping-block pattern 3a and the second doping-block pattern 3b, between the second doping-block pattern 3b and the third doping-block pattern 3c, and between the third doping-block pattern 3c and the fourth doping-block pattern 3d, which serve as the window portion, have a predetermined width.

The gaps serving as the window portions illustrated in FIGS. 19 and 20 are substantially equal in width except for the inside of the first doping-block pattern 3a. Each width of the gaps is set in consideration of the extension state of the depletion layer which occurs from the p-n junction of the n-type epitaxial growth layer 2 and the p-type semiconductor region into which the Al impurities are doped. Therefore, the width of the gap is actually not limited to the topology illustrated, and can be appropriately changed. Also, the selective doping mask is not limited to the topology illustrated in FIG. 19, and other topologies can be appropriately adopted.

Figure 21:
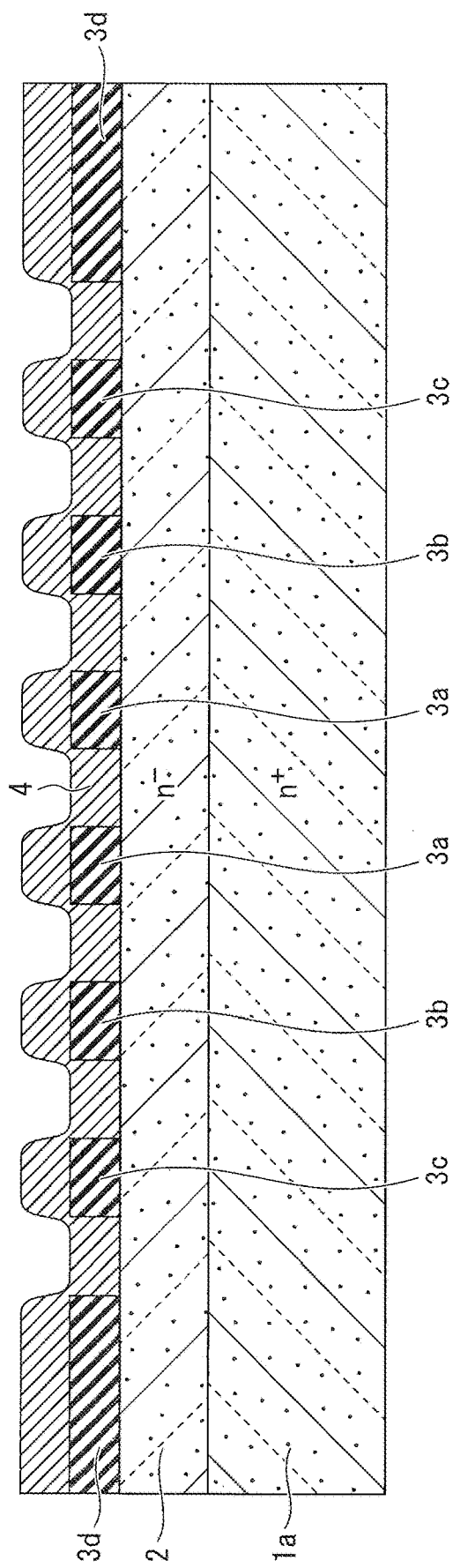
FIG. 21 is a sectional view illustrating the process of the manufacturing method of the semiconductor device according to the third embodiment (part 2)

Next, as illustrated in FIG. 21, an impurity-containing source-film 4 containing the impurity atoms serving as a p-type dopant is deposited on the epitaxial growth layer 2 with a predetermined film thickness with the selective doping masks (3a to 3d). When the impurity element is Al, the film thickness is, for example, about 240 nm. In FIG. 21, for convenience of explanation, the thicknesses of the epitaxial growth layer 2 and the impurity-containing source-film 4 are drawn at scales different from actual scales.

Figure 22:
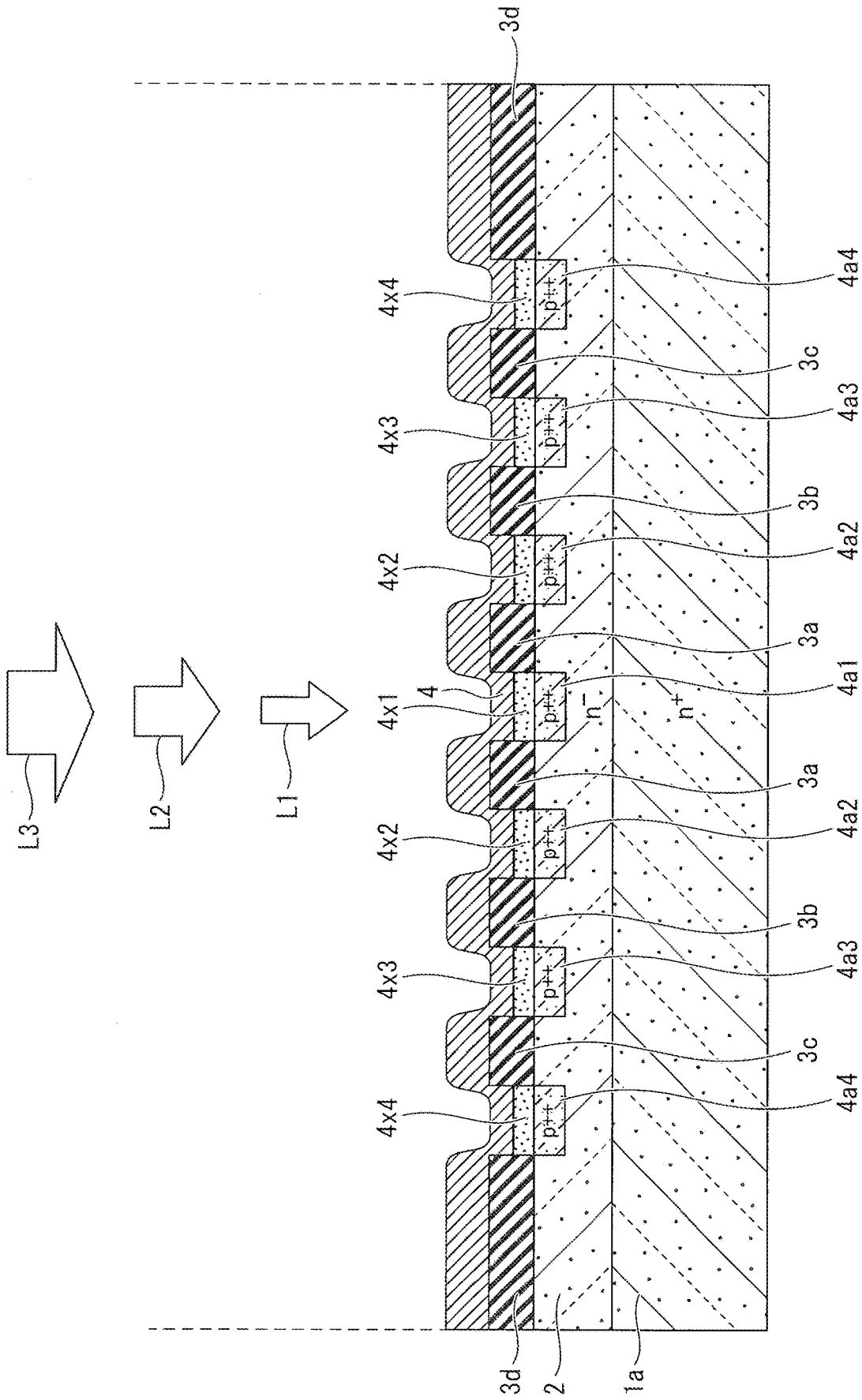
FIG. 22 is a cross-sectional view illustrating the process of the manufacturing method of the semiconductor device according to the third embodiment (part 3)

Next, as illustrated in FIG. 21, an optical pulse of the KrF excimer laser is irradiated through the impurity-containing source-film 4 in the atmospheric air by the multistage irradiation with the energy-increment scheme, in accordance with the sequence of steps described in FIGS. 4 to 9. In FIG. 22, three stages of irradiation by the first optical pulse L1, the second optical pulse L2, and the third optical pulse L3 are schematically illustrated in a superimposed manner in one figure.

In any irradiation of the first optical pulse L1 to the third optical pulse L3, the beam is shaped such that the area scheduled to be doped with the Al atoms is included without omission in the irradiation area, at least inside an outer frame indicated by dotted lines in FIG. 22, of the fourth doping-block pattern 3d. In FIG. 22, the first to third optical pulses L1, L2, L3 used in the multistage irradiation irradiate all the surfaces of the first doping-block pattern 3a to the fourth doping-block pattern 3d.

By irradiation of the first optical pulse L1 to the third optical pulse L3, a reaction-product layer 4x1 is formed on the surface of the epitaxial growth layer 2 exposed in the inner gap of the ring of the first doping-block pattern 3a. A pattern of a p$^{++}$-type semiconductor region 4a1 in which the Al atoms are selectively doped in a part of the upper portion of the epitaxial growth layer 2 at a high concentration is delineated through the reaction-product layer 4x1.

In the gaps between the first doping-block pattern 3a and the second doping-block pattern 3b, between the second doping-block pattern 3b and the third doping-block pattern 3c, and between the third doping-block pattern 3c and the fourth doping-block pattern 3d, a reaction-product layers 4x2, 4x3, 4x4 are similarly delineated, respectively. Patterns of p$^{++}$-type semiconductor regions 4a2, 4a3, 4a4 in which the Al atoms are selectively doped at a high concentration are delineated in a part of the upper portion of the epitaxial growth layer 2 through the respective reaction-product layers 4x2, 4x3, 4x4, respectively. The widths of the p$^{++}$-type semiconductor regions 4a1 to 4a4 and gaps between the p$^{++}$-type semiconductor regions 4a1 to 4a4 measured along the surface of the semiconductor substrate 1a can be changed as appropriate.

Figure 23:
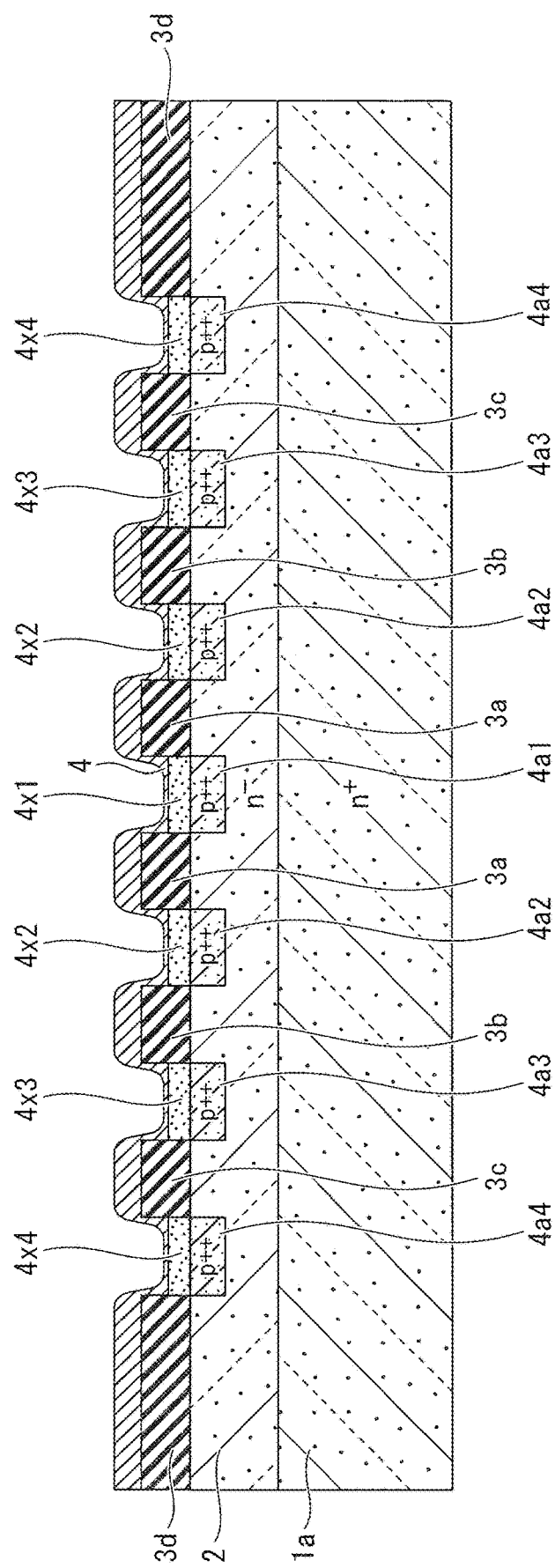
FIG. 23 is a cross-sectional view illustrating the process of the manufacturing method of the semiconductor device according to the third embodiment (part 4)

Therefore, on the upper portion of the epitaxial growth layer 2, the top surfaces of the semiconductor regions 4a1 to 4a4 into which the Al atoms are doped and the top surface of the epitaxial growth layer 2 to which the Al atoms are not doped are alternately concentrically delineated with equal intervals in a planar pattern. As illustrated in FIG. 23, a plurality of p-n junctions are formed between the n$^-$-type epitaxial growth layer 2 and the p$^{++}$-type semiconductor regions 4a1 to 4a4. The p-n junctions are locally and repeatedly formed in the epitaxial growth layer 2, and the respective edges of the p-n junctions are aligned in a plane parallel to the top surface of the epitaxial growth layer 2.

Figure 24:
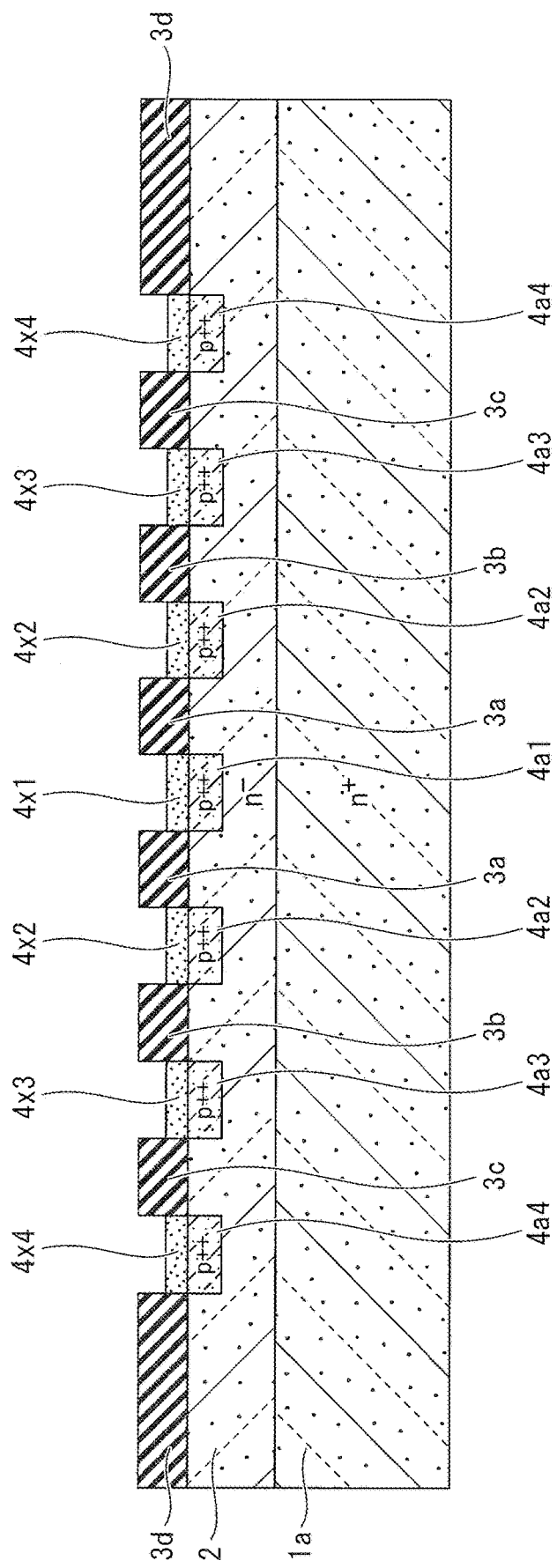
FIG. 24 is a sectional view illustrating the process of the manufacturing method of the semiconductor device according to the third embodiment (part 5)

Next, as illustrated in FIG. 24, a part of the impurity-containing source-film 4 remaining as a residue on the surfaces of the selective doping mask (3a to 3d) is removed with an etching solution. When the impurity-containing source-film 4 is Al, for example, a hydrochloric acid (HCl) solution and the like heated to about 80° C. can be used as an etchant. Moreover, various acids, such as a mixed solution of phosphoric acid (H$_3$PO$_4$), nitric acid (HNO$_3$) and acetic acid (CH$_3$COOH), an aqua regia solution and the like, can be also used.

Figure 25:
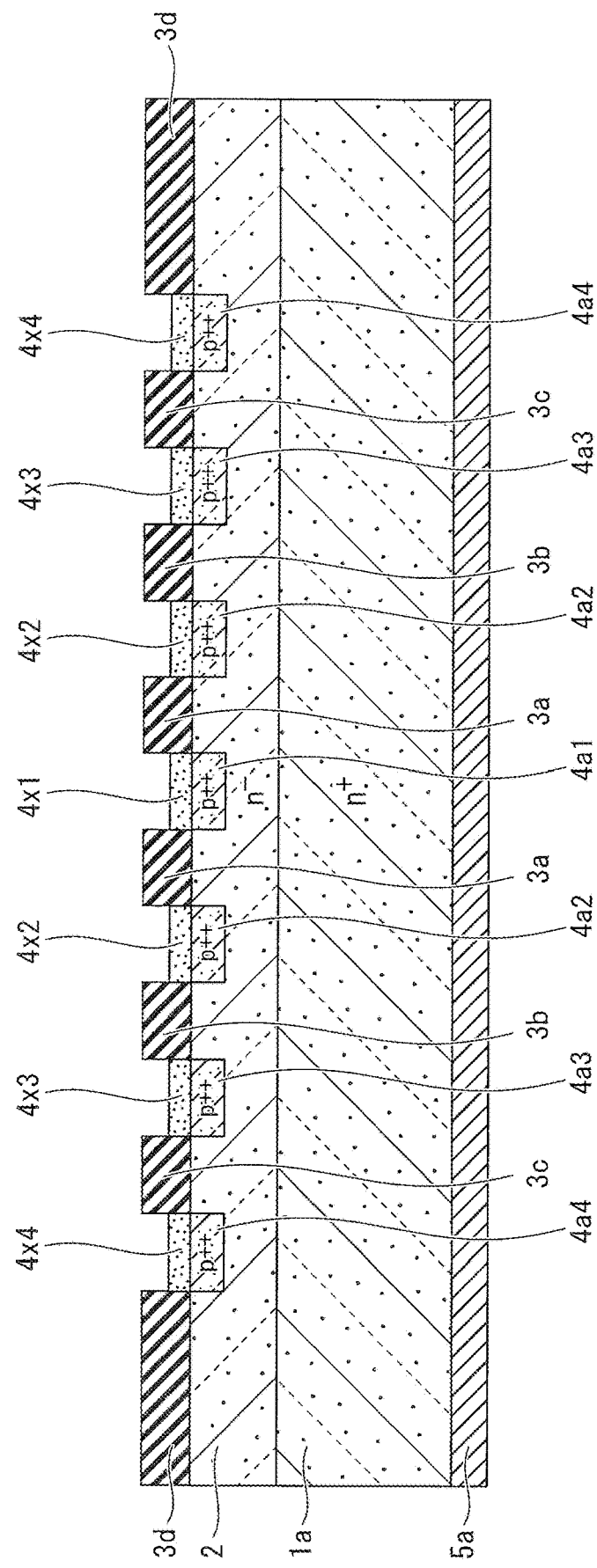
FIG. 25 is a cross-sectional view illustrating the process of the manufacturing method of the semiconductor device according to the third embodiment (part 6)

Next, a thin metallic film of Ni or the like is deposited as a contact seed layer on the back surface of the semiconductor substrate 1a by sputtering method, vacuum evaporation method, CVD method and the like. Thereafter, as illustrated in FIG. 25, the semiconductor substrate 1a is heated to about 1000° C. to form an ohmic-contact layer 5a from the contact seed layer as a cathode electrode film.

Although illustration is omitted, a photoresist film which covers the third doping-block pattern 3c and the fourth doping-block pattern 3d out of the selective doping mask (3a to 3d) is delineated using a photolithography technique. By using the photoresist film as an etching mask, only the first doping-block pattern 3a and the second doping-block pattern 3b on the top surface of the epitaxial growth layer 2 are selectively etched and removed by a buffered hydrofluoric acid (BHF) solution and the like.

Figure 26:
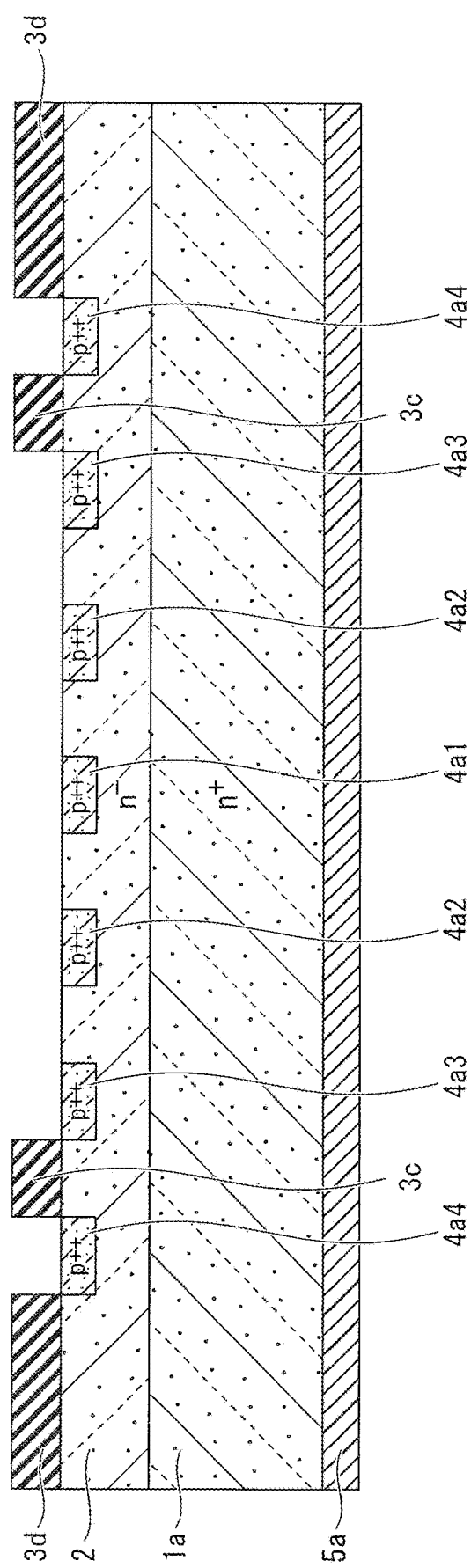
FIG. 26 is a cross-sectional view illustrating the process of the manufacturing method of the semiconductor device according to the third embodiment (part 7)

Next, by treating the surface of the epitaxial growth layer 2 by plasma etching using a tetrafluoromethane ($CF_4$) gas and the like for about 20 minutes, as illustrated in FIG. 26, the unnecessary reaction-product layer 4x which remains on the surface of the epitaxial growth layer 2 and the photoresist film are removed. On the top surface of the epitaxial growth layer 2, a pattern in which only the third doping-block pattern 3c and the fourth doping-block pattern 3d are left is formed, and in the center portion of the top surface of the epitaxial growth layer 2, the circular window portion in a planar pattern is cut. On the window portion, the top surfaces of the $p^{++}$-type semiconductor regions 4a1 to 4a3, which are selectively doped in the upper portion of the epitaxial growth layer 2, are exposed.

Figure 27:
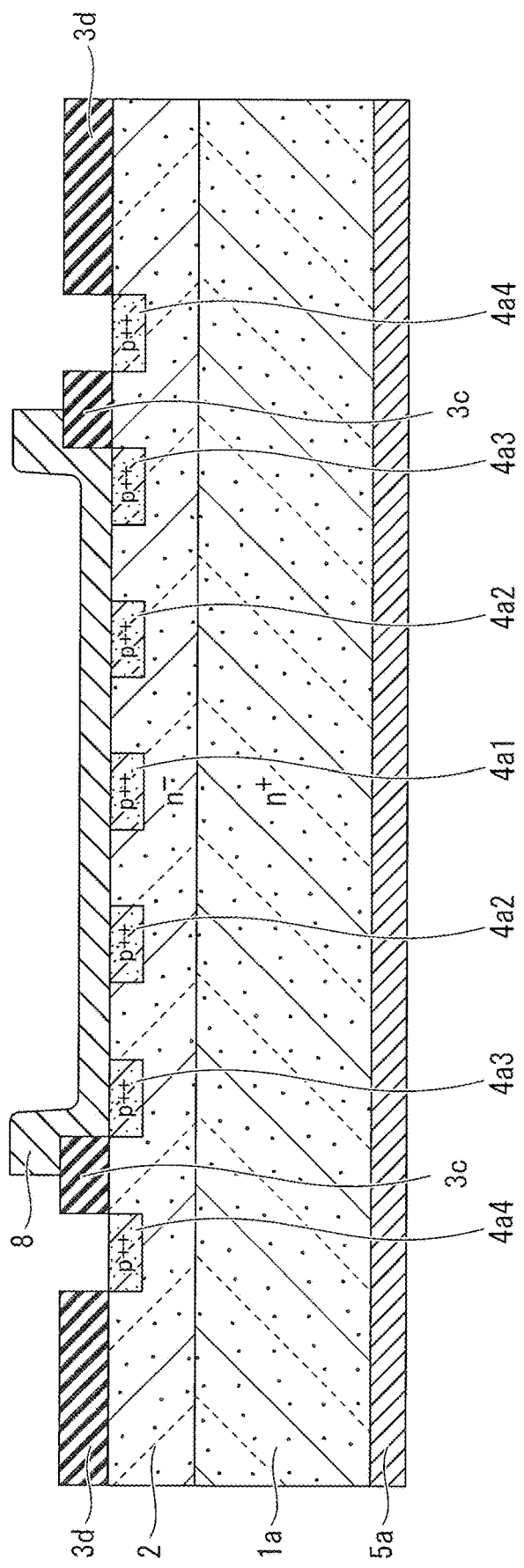
FIG. 27 is a cross-sectional view illustrating the process of the manufacturing method of the semiconductor device according to the third embodiment (part 8)

Next, a metallic film, such as Al, Ti and the like, is deposited to a thickness of about 300 nm, for example, by sputtering method, vacuum evaporation method, CVD method and the like so as to cover the window portion on the surface of the epitaxial growth layer 2. Then, an etching mask is delineated by a photolithography technique so as to selectively etch the metallic film, and the anode electrode film 8 is delineated as illustrated in FIG. 27. For the selective etching, wet etching using an etching solution, such as a $H_3PO_4$—$HNO_3$-based etchant and the like, or dry etching using a gas, such as a chlorine (Cl)-based gas and the like, may be used. In FIG. 27, a metallic film is also laminated on a part of the inner edge side on the top surface of the third doping-block pattern 3c so as to form the peripheral portion of the anode electrode film 8.

Thereafter, the composite structure (1a, 2) as the doping-object is annealed for a predetermined time at a predetermined temperature. By annealing, Schottky junctions are formed in interfaces between portions of the epitaxial growth layer 2 and the anode electrode film 8, and ohmic junctions are formed in interfaces between the $p^{++}$-type semiconductor regions 4a1 to 4a3 and the anode electrode film 8. Thus, a junction barrier Schottky (JBS) structure is formed in a desired region above the top surface of the semiconductor substrate 1a.

Next, a polyimide film and the like is coated on the entire top surface of the composite structure (1a, 2) including the anode electrode film 8 to forma passivation film 3e. The passivation film 3e may be coated after appropriately forming an interlayer insulating film having a necessary thickness by separately laminating an additional $SiO_2$ film on the third doping-block pattern 3c and the fourth doping-block pattern 3d using CVD method and the like.

Next, a part of the passivation film 3e on the anode electrode film 8 is delineated by a photolithography technique and an etching technique to cut a contact hole. In addition, when a photosensitive polyimide film is used, the contact hole can be cut by omitting the coating step of the photoresist film. Next, a metallic film, such as an Al film, an Al alloy film and the like, is deposited on the top surface of the passivation film 3e having the contact hole by sputtering method, vacuum evaporation method, CVD method and the like to a thickness of about 1 µm, for example. A photoresist film is coated on the metallic film, and the photoresist film is delineated by a photolithography technique and an etching technique.

Figure 28:
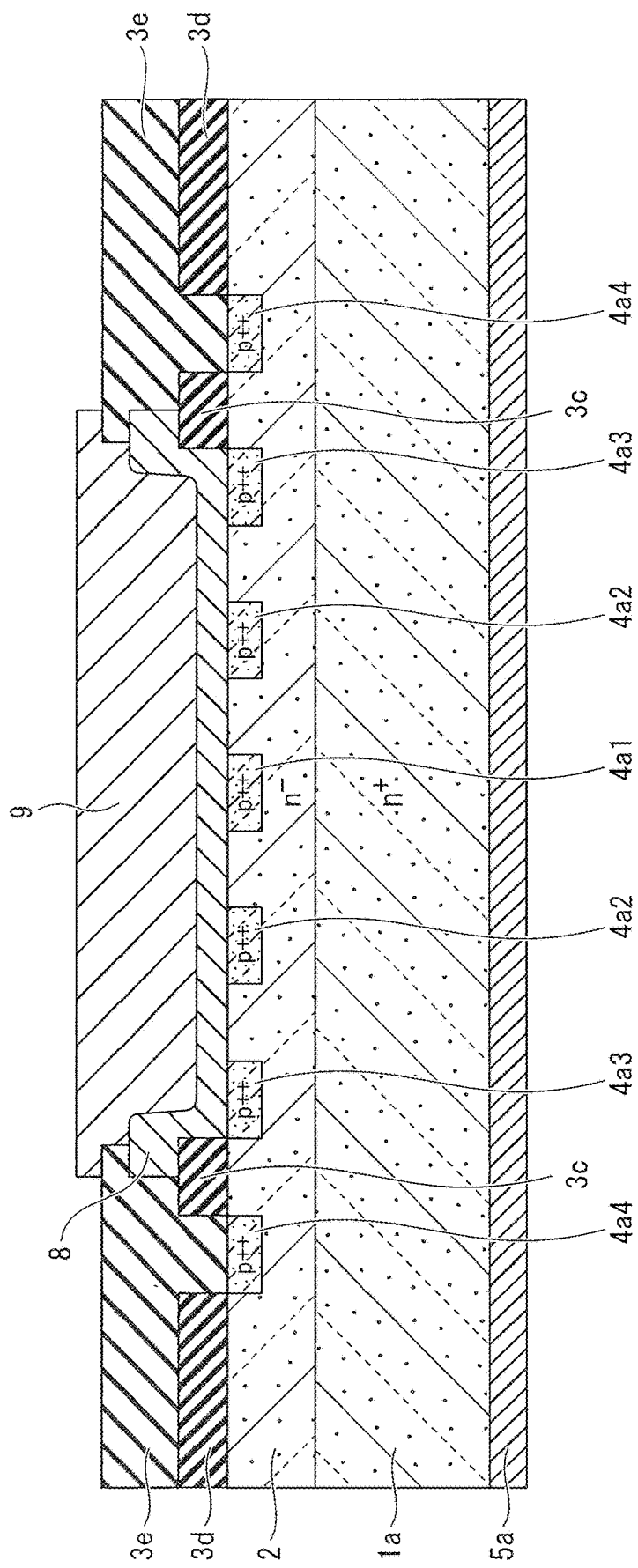
FIG. 28 is a cross-sectional view illustrating the process of the manufacturing method of the semiconductor device according to the third embodiment (part 9).

As illustrated in FIG. 28, an electrode pad 9 is formed by selectively etching the metallic film using the delineated photoresist film as an etching mask, and a vertical JBS element can be obtained. Thereafter, the semiconductor substrate 1a is diced into a plurality of chips to obtain a semiconductor chip. Then, the semiconductor chip is mounted in a package and the interconnection wire and the like is connected to the electrode pad 9 on the semiconductor chip by a bonding method, such as wire bonding and the like. Thus, the manufacturing process of the semiconductor device according to the third embodiment is completed. Optionally, in accordance with the process design, the ohmic-contact layer 5a as the cathode electrode film may be not formed earlier. For example, the ohmic-contact layer 5a may be formed using a metallic film such as Ni after forming the electrode pad 9 illustrated in FIG. 28.

According to the method of manufacturing the semiconductor device pertaining to the third embodiment, it is possible to achieve a high-quality p-n junction device having both the Schottky junction and the ohmic contact. Moreover, in the method of manufacturing the semiconductor device according to the third embodiment, the cathode electrode film may be formed before the anode electrode film 8. Thus, the annealing temperature after deposition of the anode electrode film 8 may be lower than that of the cathode electrode film. For example, when the annealing temperature of the cathode electrode film is about 900° C., the annealing temperature of the anode electrode film 8 may be about 500° C. By setting the annealing temperature after deposition of the anode electrode film 8 lower than that of the cathode electrode film, the characteristics of the Schottky junction between the epitaxial growth layer 2 and the anode electrode film 8, and the characteristics of the ohmic contact between the semiconductor substrate 1a and the cathode electrode film can be improved. The other effectiveness of the method for manufacturing the semiconductor device according to the third embodiment are the same as those in the first and second embodiments.

Other Embodiments

While the present invention has been described above by reference to the first to third embodiments, it should be understood that the present invention is not intended to be limited to the descriptions of the Specification and the drawings implementing part of this disclosure. Various alternative embodiments, examples, and technical applications will be apparent to those skilled in the art according to this disclosure.

For example, in the first to third embodiments, a p-type dopant is used as the impurity element, because an n-type semiconductor is assigned as the semiconductor substrate. However, the present invention is not limited to the above assignment, and alternatively, the conductivity type may be reversed. That is, an impurity-doped region of an arbitrary conductivity type can be formed in a semiconductor substrate of an arbitrary conductivity type. Furthermore, although the doping system illustrated in FIG. 1 is described as including the deposition apparatus 10 and the light-irradiation apparatus 20, the doping system according to the present invention is not limited to the configuration illustrated in FIG. 1. As the doping system according to the present invention, the deposition apparatus 10 may not be the essential constituent element of the present invention as long as the impurity-containing source-film 4 having a certain thickness can be prepared.

Further, in the method of manufacturing a semiconductor device according to the first to third embodiments, the p-n junction-diode has been described as a typical example of a semiconductor device, but the semiconductor device is not limited to the p-n junction-diode. For example, a p-i-n diode, a p-n-p diode, a p-i-p diode, an n-p-n diode, an n-i-n diode and the like may be used. Furthermore, for example, a p-n⁻-p diode or a p-n-p diode can be achieved by preparing an n⁻-type semiconductor substrate as the doping-object 1 and doping the p-type impurities through the top surface and the bottom surface of the semiconductor substrate by the doping method according to the present invention.

Further, the present invention may be applied to a discrete device (discrete semiconductor device), such as field effect transistor (FET), bipolar junction transistor (BJT), insulated gate bipolar transistor (IGBT), static induction transistor (SIT), gate turn-off (GTO) thyristor, static induction (SI) thyristor and the like. For example, by preparing an n⁻-type semiconductor substrate as the doping-object 1 as described above and doping the p-type impurities through the top surface and the bottom surface of the semiconductor substrate by the doping method according to the present invention, the structure of the p-n-p diode may be achieved. Then, using the p-type semiconductor region on the top surface as the p-base region, the emitter region may be formed in the p-type semiconductor region, and the p-type semiconductor region on the bottom surface may be used as the collector region, and thus, a basic structure, such as BJT, IGBT and the like may be completed.

Further, the present invention can be applied to various semiconductor devices, such as a semiconductor integrated circuit, an optical semiconductor device and the like, in which the discrete devices are monolithically integrated. Furthermore, it is possible to apply to a semiconductor device which is an element of a power semiconductor module or a hybrid integrated circuit. As described above, it should be noted that the present invention includes various embodiments which are not disclosed herein. Therefore, the scope of the present invention is defined only by "the technical features specifying the invention" prescribed by the claims reasonably derived from the description heretofore.

What is claimed is:

1. A doping method comprising:
    depositing an impurity-containing source-film containing impurity atoms on a top surface of a doping-object made of silicon carbide;
    forming a reaction-product layer in the doping-object by irradiating a first optical pulse to the impurity-containing source-film; and
    doping the impurity atoms into the doping-object through the reaction-product layer by irradiating a second optical pulse to the impurity-containing source-film, the second optical pulse having an energy density higher than an energy density of the first optical pulse.

2. The doping method of claim 1, wherein the impurity atoms are aluminum atoms.

3. The doping method of claim 1, wherein the energy density of the first optical pulse is 1.0 J/cm² or more and 3.0 J/cm² or less.

4. The doping method of claim 1, wherein the energy density of the second optical pulse is 6.0 J/cm² or less.

5. The doping method of claim 1, wherein each wavelength of the first optical pulse and the second optical pulse is longer than 190 nm.

6. The doping method of claim 1, wherein the doping-object is maintained in a temperature range of 27° C. or more to 500° C. or less, and each step of irradiating the first optical pulse and the second optical pulse is carried out.

7. A method for manufacturing a silicon carbide semiconductor device comprising:
    on a surface of a semiconductor region of silicon carbide having a first conductivity type, depositing an impurity-containing source-film containing impurity atoms of a second conductivity type;
    forming a reaction-product layer in the semiconductor region by irradiating a first optical pulse to the impurity-containing source-film;
    doping the impurity atoms into the semiconductor region through the reaction-product layer by irradiating a second optical pulse to the impurity-containing source-film so as to form an impurity-doped region of the second conductivity type, the second optical pulse having an energy density higher than an energy density of the first optical pulse; and
    forming a semiconductor device structure including a p-n junction between the semiconductor region and the impurity-doped region.

* * * * *